US009646837B2

(12) United States Patent
Ninomiya et al.

(10) Patent No.: US 9,646,837 B2
(45) Date of Patent: May 9, 2017

(54) ION IMPLANTATION METHOD AND ION IMPLANTATION APPARATUS

(71) Applicant: SEN Corporation, Shinagawa-ku, Tokyo (JP)

(72) Inventors: Shiro Ninomiya, Tokyo (JP); Yasuharu Okamoto, Tokyo (JP); Masaki Ishikawa, Tokyo (JP); Takeshi Kurose, Tokyo (JP); Akihiro Ochi, Tokyo (JP)

(73) Assignee: SEN CORPORATION, Shinagawa (JP)

( * ) Notice: Subject to any disclaimer, the term of this patent is extended or adjusted under 35 U.S.C. 154(b) by 371 days.

(21) Appl. No.: 13/710,174

(22) Filed: Dec. 10, 2012

(65) Prior Publication Data
US 2013/0157390 A1    Jun. 20, 2013

(30) Foreign Application Priority Data
Dec. 19, 2011   (JP) .................. 2011-277427

(51) Int. Cl.
*H01J 37/304*   (2006.01)
*H01J 37/317*   (2006.01)
*H01L 21/265*   (2006.01)

(52) U.S. Cl.
CPC .......... *H01L 21/265* (2013.01); *H01J 37/304* (2013.01); *H01J 37/3171* (2013.01);
(Continued)

(58) Field of Classification Search
CPC .................................................. H01J 37/317
See application file for complete search history.

(56) References Cited

U.S. PATENT DOCUMENTS 4,421,988 A * 12/1983 Robertson ........... H01J 37/3171
                                                    250/398
4,736,107 A *  4/1988 Myron ................ H01J 37/3171
                                                    250/492.2
(Continued)

FOREIGN PATENT DOCUMENTS

CN         1691269 A    11/2005
CN       101061563 A    10/2007
(Continued)

OTHER PUBLICATIONS

Japanese Office Action dated Jul. 2, 2014 issued in Japanese Patent Application No. 2011-277427.
(Continued)

*Primary Examiner* — Wyatt Stoffa
*Assistant Examiner* — James Choi
(74) *Attorney, Agent, or Firm* — Arent Fox LLP

(57) ABSTRACT

An ion implantation method includes transporting ions to a wafer as an ion beam, causing the wafer to undergo wafer mechanical slow scanning and also causing the ion beam to undergo beam fast scanning or causing the wafer to undergo wafer mechanical fast scanning in a direction perpendicular to a wafer slow scanning direction, irradiating the wafer with the ion beam by using the wafer slow scanning in the wafer slow scanning direction and the beam fast scanning of the ion beam or the wafer fast scanning of the wafer in the direction perpendicular to the wafer slow scanning direction, measuring a two-dimensional beam shape of the ion beam before ion implantation into the wafer, and defining an implantation and irradiation region of the ion beam by using the measured two-dimensional beam shape to thereby regulate the implantation and irradiation region.

5 Claims, 12 Drawing Sheets

(52) U.S. Cl.
CPC ............... *H01J 2237/30477* (2013.01); *H01J 2237/30488* (2013.01)

(56) References Cited

U.S. PATENT DOCUMENTS

| | | | |
|---|---|---|---|
| 6,953,942 B1 | 10/2005 | Graf et al. | |
| 7,176,470 B1* | 2/2007 | Evans et al. | ............. 250/492.21 |
| 7,282,427 B1* | 10/2007 | Murrell | ................. H01J 37/304 |
| | | | 438/511 |
| 2002/0003215 A1* | 1/2002 | Berrian | ................. H01J 37/147 |
| | | | 250/492.3 |
| 2003/0192474 A1 | 10/2003 | Smick et al. | |
| 2004/0019193 A1 | 1/2004 | Liang | |
| 2004/0191931 A1* | 9/2004 | Murrell | ............... H01J 37/3023 |
| | | | 438/7 |
| 2005/0024610 A1* | 2/2005 | Nishi | .................. G03F 7/70425 |
| | | | 355/53 |
| 2005/0133734 A1* | 6/2005 | Moriya | .................. B82Y 10/00 |
| | | | 250/492.2 |
| 2006/0097196 A1 | 5/2006 | Graf et al. | |
| 2006/0113489 A1* | 6/2006 | Ray | .................... H01J 37/3023 |
| | | | 250/492.21 |
| 2007/0114456 A1* | 5/2007 | Yasuda | .................... 250/492.21 |
| 2008/0035862 A1 | 2/2008 | Eisner et al. | |
| 2009/0032726 A1 | 2/2009 | Sieradzki et al. | |
| 2011/0297842 A1* | 12/2011 | Ninomiya | ............. H01J 37/304 |
| | | | 250/396 ML |

FOREIGN PATENT DOCUMENTS

| | | |
|---|---|---|
| CN | 101124649 A | 2/2008 |
| CN | 101197241 A | 6/2008 |
| CN | 101501812 A | 8/2009 |
| JP | 2005-203771 A | 7/2005 |
| JP | 2007-200791 A | 8/2007 |
| JP | 2008-519417 A | 6/2008 |
| JP | 2009-038031 A | 2/2009 |
| JP | 2009-146757 A | 7/2009 |

OTHER PUBLICATIONS

Ninomiya et al., "Productivity Improvement for the SHX-SEN's Single-Wafer High-Current Ion Implanter," Ion Implantation Technology 2010, US, American Institute of Physics, 2010, 341-344.

* cited by examiner

ION IMPLANTATION METHOD AND ION IMPLANTATION APPARATUS

This application is based upon and claims the benefit of priority from Japanese Patent Application No. 2011-277427, filed on Dec. 19, 2011, the disclosure of which is incorporated herein in its entirety by reference.

TECHNICAL FIELD

The present invention relates to ion implantation, and more particularly to a control technique of a region implanted by and irradiated with an ion beam in an ion implantation apparatus.

BACKGROUND ART

In semiconductor manufacturing processes, a process for irradiating a semiconductor wafer with ions which are implanted into the semiconductor wafer is performed in a standard procedure for the purpose of varying conductivity, varying a crystalline structure of the wafer, or the like. An apparatus used in this process is called an ion implantation apparatus. The ion implantation apparatus has a function of accelerating ions generated by an ion source so as to form an accelerated ion beam, and a function of irradiating the entire surface of the semiconductor wafer with the ion beam, through beam scanning, wafer scanning, or a combination thereof. In this case, to what extent ions are implanted into a semiconductor wafer is defined by a semiconductor design, and after the semiconductor design is set once, it is difficult to change the semiconductor design.

There are many types of ion implantation apparatuses, used for semiconductor manufacturing processes, transporting ions generated by an ion source to a wafer as an ion beam. As one type thereof, there is an ion implantation apparatus where slow scanning of a wafer and fast scanning of an ion beam are combined. In the slow scanning of a wafer, a direction in which the wafer undergoes mechanical slow scanning (slow movement) is set as a wafer slow scanning direction. On the other hand, in the fast scanning of an ion beam, a direction in which the ion beam undergoes fast scanning in a direction perpendicular to the wafer slow scanning direction is set as a beam scanning direction (or a fast scanning direction). Thereby, a wafer which is mechanically driven so as to be reciprocally moved in the wafer slow scanning direction is irradiated with an ion beam which reciprocally scans in the beam scanning direction. This ion implantation apparatus is also called a hybrid scanning ion implantation apparatus.

In addition, as another type, there is an ion implantation apparatus using two-dimensional mechanical wafer scanning where slow scanning of a wafer and fast scanning of a wafer are combined. In the wafer mechanical slow scanning, a direction in which a wafer undergoes mechanical slow scanning (slow movement) is set as a wafer slow scanning direction. On the other hand, in the wafer mechanical fast scanning, a wafer fast scanning direction in which a wafer undergoes mechanical fast scanning (fast movement faster than slow movement) in a direction perpendicular to the wafer slow scanning direction is set as the same direction as the beam scanning direction of the hybrid scanning ion implantation apparatus. Thereby, a wafer which is driven so as to be reciprocally moved in the wafer slow scanning direction and also reciprocally moved in the wafer fast scanning direction perpendicular to the wafer slow scanning direction is irradiated with an ion beam (a static ion beam). This ion implantation apparatus is called a two-dimensional mechanical wafer scanning ion implantation apparatus.

As described later, certain embodiments of the present invention may be applied to any one of the hybrid scanning ion implantation apparatus and the two-dimensional mechanical wafer scanning ion implantation apparatus.

In the semiconductor manufacturing processes, semiconductor wafer productivity (hereinafter, abbreviated to wafer productivity) is regarded to be important. As described above, an ion implantation amount to be implanted into a semiconductor wafer in a certain semiconductor manufacturing process is defined. Therefore, in order to increase wafer productivity, it is necessary to increase an amount of ions transported to a semiconductor wafer or efficiently implant ions into a semiconductor wafer.

As described later, the present invention relates to high efficiency ion implantation into a semiconductor wafer.

However, if ions are to be implanted into a semiconductor wafer with high efficiency, typically, the same amount of ions are required to be implanted into the entire surface of the semiconductor wafer in order to manufacture semiconductor devices with the same quality (characteristics) in the wafer surface. In other words, it is necessary to secure wafer in-surface uniformity of an ion implantation amount. Therefore, it is necessary to secure wafer in-surface uniformity of an ion implantation amount and improve wafer productivity.

In the hybrid scanning ion implantation apparatus, as described above, an ion beam reciprocally scans in a beam scanning direction, and a semiconductor wafer is mechanically scanned (moved) in a wafer slow scanning direction perpendicular to the beam scanning direction, thereby implanting ions into the semiconductor wafer. Here, if high efficiency ion implantation into a semiconductor wafer is to be considered, as described later in detail, it may be considered that a semiconductor wafer is fixed and an ion beam is relatively moved. This is also the same for the two-dimensional mechanical wafer scanning ion implantation apparatus. In this case, as one method of high efficiency ion implantation into a semiconductor wafer, there may be a technique of controlling a scanning range (irradiation range) of an ion beam so as to be suitable for a shape of the semiconductor wafer.

Here, in the hybrid scanning ion implantation apparatus, as the technique for controlling a scanning range of an ion beam so as to be suitable for a shape of a semiconductor wafer, there has been proposed a technique for performing control such that a scanning range on a holding member exceeding a shape range of a semiconductor wafer is the same (Patent Literature 1). The holding member is used to hold a semiconductor wafer, and is driven so as to be reciprocally moved in a wafer slow scanning direction in a state of holding the semiconductor wafer.

Patent Literature 1: JP-2009-146757

SUMMARY

The technique disclosed in Patent Literature 1 is employed for the purpose of reducing an implantation angle variation in ion implantation using secondary electron supply from the holding member, and thus the purpose thereof is different from a purpose of increasing efficiency of ion implantation into a semiconductor wafer. Therefore, the technique disclosed in Patent Literature 1 is in sufficient to improve wafer productivity.

In the technique disclosed in Patent Literature 1, it is not considered that an implantation and irradiation region of an ion beam forms a two-dimensional shape, and thus wafer in-surface uniformity of an ion implantation amount at end portions of the semiconductor wafer in a horizontal direction deteriorates. In addition, in a case of increasing a scanning range of an ion beam on the holding member exceeding a shape range of a semiconductor wafer in order to prevent such deterioration in wafer in-surface uniformity of an ion implantation amount, the purpose of improving wafer productivity may not be achieved.

In the technique disclosed in Patent Literature 1, it is not considered that there are cases where a beam position used as a reference is shifted from a central position of a semiconductor wafer in a vertical direction in the hybrid scanning ion implantation apparatus, and thus in-surface uniformity of an ion implantation amount at end portions in a vertical direction of the semiconductor wafer deteriorates. In addition, in a case of increasing a scanning range of an ion beam on the holding member exceeding a shape range of a semiconductor wafer in order to prevent such deterioration in in-surface uniformity of an ion implantation amount, the purpose of improving wafer productivity may not be achieved.

In the technique disclosed in Patent Literature 1, in the hybrid scanning ion implantation apparatus, the scanning area of an ion beam on the holding member of a semiconductor wafer is controlled so as to be the same. However, the control for the same scanning area does not achieve the purpose of increasing efficiency of on implantation into a semiconductor wafer and is limited to a case where efficiency of ion implantation into a semiconductor wafer secondarily increases.

It is desirable to handle a two-dimensional shape of an implantation and irradiation region of an ion beam, secure wafer in-surface uniformity of an ion implantation amount, and improve semiconductor wafer productivity in a hybrid scanning ion implantation apparatus and a two-dimensional mechanical wafer scanning ion implantation apparatus.

Certain embodiments of the present invention are applied to the hybrid scanning ion implantation apparatus and the two-dimensional mechanical wafer scanning ion implantation apparatus.

According to an embodiment of the present invention, there is provided an ion implantation method including measuring a two-dimensional cross-sectional beam shape of the ion beam in advance before ion implantation into the wafer, making the two-dimensional cross-sectional beam shape be similar to an elliptical shape by using the measured two-dimensional cross-sectional beam shape, setting an irradiation range of the ion beam by using a common tangent of an outer circumference of the elliptical beam and an outer circumference of the wafer, and thereby defining an implantation and irradiation region.

The implantation and irradiation region of the ion beam may be regulated by using the common tangent of the outer circumference of the elliptical beam and the outer circumference of the wafer in an entire region of the outer circumference of the wafer.

In order to secure wafer in-surface uniformity of an ion implantation amount and improve wafer productivity even in a case where a slight variation in an ion current amount occurs during ion implantation into the wafer, one side of the implantation and irradiation region which is divided into two by a straight line including a wafer diameter in the wafer slow scanning direction may have a rectangular shape, and the other side of the implantation and irradiation region may have a shape regulated by the common tangent.

In addition, a plurality of beam scanning terminal end positions in the beam scanning direction (or the wafer fast scanning direction) may be set in stages, and set values of the beam scanning terminal end positions may be changed in stages according to wafer scanning positions in the wafer slow scanning direction without stopping the ion implantation into the wafer, thereby implanting ions into the entire surface of the wafer.

Here, at least one of the wafer scanning positions in the wafer slow scanning direction in which the set values of the plurality of set beam scanning terminal end positions are changed may be a wafer scanning position in the wafer slow scanning direction in which a beam centroid position in the wafer slow scanning direction is present inside the wafer, and at least another one of the wafer scanning positions may be a wafer scanning position in the wafer slow scanning direction in which a beam centroid position in the wafer slow scanning direction is present outside the wafer.

According to another embodiment of the present invention, there is provided an ion implantation apparatus including a measurement device that measures a two-dimensional cross-sectional beam shape of a scanned ion beam before ion implantation into the wafer, and a controller that makes the measured two-dimensional cross-sectional beam shape similar to an elliptical shape by using the measured two-dimensional cross-sectional beam shape, sets an irradiation range of the ion beam by using a common tangent of an outer circumference of the elliptical beam and an outer circumference of the wafer, and thereby regulates an implantation and irradiation region.

The controller may regulate the implantation and irradiation region by using the common tangent of the outer circumference of the elliptical beam and the outer circumference of the wafer in an entire region of the outer circumference of the wafer.

In order to secure wafer in-surface uniformity of an ion implantation amount and improve wafer productivity even in a case where a slight variation in an ion current amount occurs during ion implantation into the wafer, the controller may regulate an implantation and irradiation region where one side of the implantation and irradiation region which is divided into two by a straight line including a wafer diameter in the wafer slow scanning direction has a rectangular shape, and the other side of the implantation and irradiation region has a shape regulated by the common tangent.

DESCRIPTION OF EXEMPLARY EMBODIMENTS

Figure 1A:
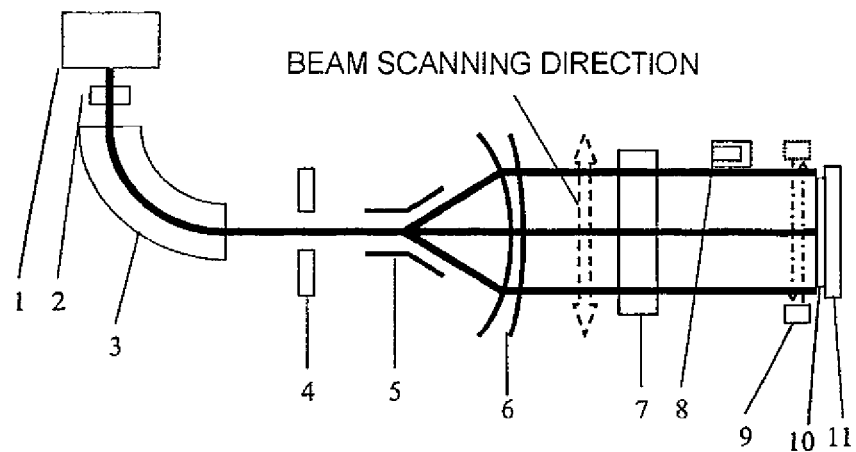
FIGS. 1A and 1B are respectively a plan view (FIG. 1A) and a side view (FIG. 1B) illustrating an example of the schematic configuration of an ion implantation apparatus according to an embodiment of the present invention.
Figure 1B:
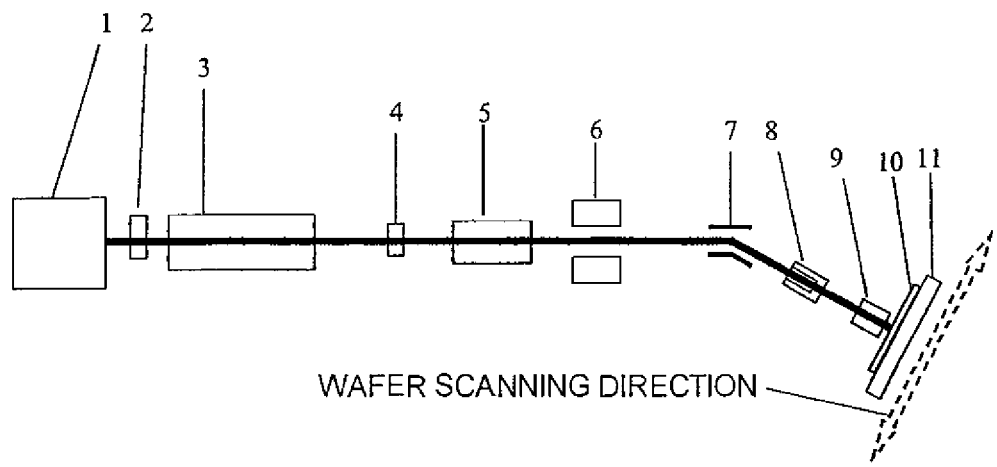

Embodiments of the present invention will be described. Certain embodiments of the present invention may be applied to any one of a hybrid scanning ion implantation apparatus and a two-dimensional mechanical wafer scanning ion implantation apparatus. First, with reference to FIGS. 1A and 1B, the hybrid scanning ion implantation apparatus with a more complicated structure will be described. FIG. 1A is a plan view and FIG. 1B is a side view. In the hybrid scanning ion implantation apparatus, ions generated by an ion source 1 are extracted by an extraction electrode 2 as an ion beam, and the extracted ion beam is transported along a beam line reaching a semiconductor wafer 10. Along the beam line, a mass spectrometry magnet device 3, a mass spectrometry slit 4, a beam scanner 5, and a wafer processing chamber (ion implantation chamber) are disposed. In the wafer processing chamber, a mechanical scanning device 11 including a holding mechanism holding the semiconductor wafer 10 is disposed. The holding mechanism includes a wafer holder which holds the semiconductor wafer 10. The ion beam extracted through the extraction electrode 2 is transported along the beam line and is guided to the semiconductor wafer 10 on the wafer holder disposed at an ion implantation position of the wafer processing chamber.

The ion beam reciprocally scans (irradiates) by the beam scanner 5 in a beam scanning direction (or a fast scanning direction). The ion beam incident to the beam scanner 5 is fixed in a traveling direction but has an angle deflected by the beam scanner 5 with respect to the fixed traveling direction when incident to the beam scanner. However, the ion beam with a deflected angle with respect to the fixed traveling direction becomes parallel so as to be parallel to the fixed traveling direction by a function of a parallel lenses 6 and is then guided to the semiconductor wafer 10. In the hybrid scanning ion implantation apparatus, the semiconductor wafer 10 is mechanically reciprocally scanned (moved) in a wafer slow scanning direction perpendicular to the beam scanning direction, thereby implanting ions into the semiconductor wafer 10. The ion beam irradiated in this way is hereinafter referred to as a scanned ion beam in some cases. In FIGS. 1A and 1B, the ion beam is deflected downwardly by an angle energy filter 7 which is disposed on the downstream side of the parallel lenses 6, thereby increasing uniformity of ion energy. However, this is an example, and the angle energy filter 7 may be omitted.

In the present embodiment, the ion beam is measured on the upstream side close to the semiconductor wafer 10. A wafer region beam measurement device 9 is used to measure an ion beam. In FIG. 1A, the wafer region beam measurement device 9 is shown so as to be reciprocally moved in a range indicated by the dot chain line arrow, but the wafer region beam measurement device may be of a non-movable type. The reciprocal movement range of the wafer region beam measurement device 9 indicated by a dot chain line arrow is wider than a scanning range (irradiation range) of the ion beam. In addition, hereinafter, for simplicity of description, the description will be made using a movable type wafer region beam measurement device 9.

The wafer region beam measurement device 9 cannot be used due to physical interference with the semiconductor wafer 10 when the ion implantation into the semiconductor wafer 10 is in progress. In the hybrid scanning ion implantation apparatus shown in FIGS. 1A and 1B, a scanned ion beam is measured using an implantation-in-progress beam measurement device 8 when the ion implantation into the semiconductor wafer 10 is in progress. As described later in detail, when an abnormal implantation state occurs, such as a case where a slight beam variation occurs in the hybrid scanning ion implantation apparatus, or a case where discharge occurs in beam transport equipment from the ion source 1 to the semiconductor wafer 10 and thus ions do not arrive at the semiconductor wafer 10, there are cases of handling the abnormal implantation state by using a measurement result of the implantation-in-progress beam measurement device 8, so as to prevent deterioration in wafer in-surface uniformity of an ion implantation amount.

In FIGS. 1A and 1B, a single implantation-in-progress beam measurement device 8 is shown at one of two positions which are outermost parts in the scanning range of an ion beam further on the upstream side than the semiconductor wafer 10. However, this is an example, and, the implantation-in-progress beam measurement device 8 may be disposed on the semiconductor wafer 10 side, may be disposed at a position further on the downstream side than the semiconductor wafer 10, or may be disposed at the other end of the two positions. In addition, generally, there are cases where a plurality of implantation-in-progress beam measurement devices are disposed in the hybrid scanning ion implantation apparatus. In contrast, since, in the present embodiment, a single implantation-in-progress beam measurement device 8 is disposed and thereby the purpose can be achieved, in the following, a description will be made of a case where a single implantation-in-progress beam measurement device 8 is disposed.

Figure 2:
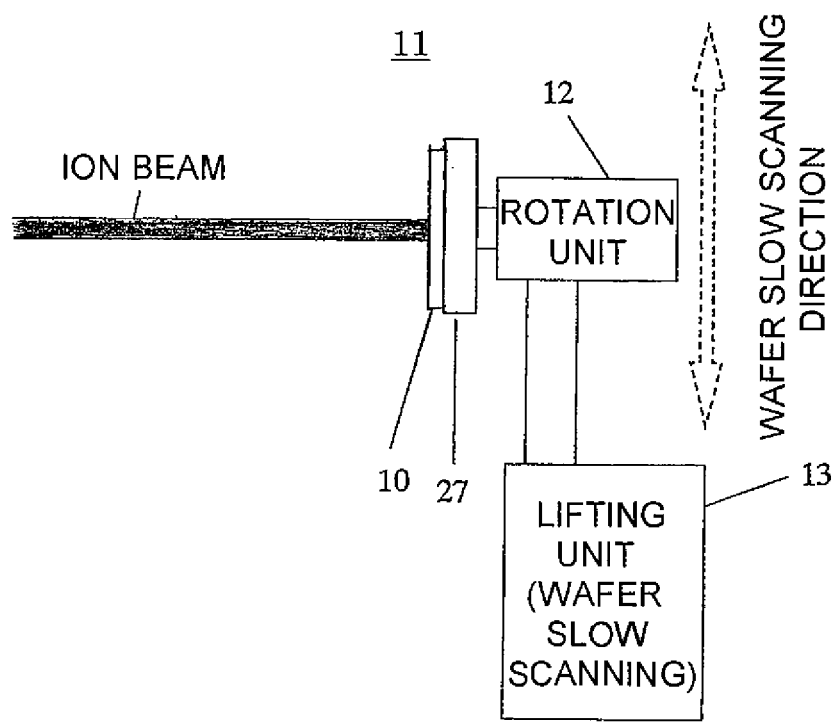
FIG. 2 is a schematic diagram illustrating a mechanical scanning device in the ion implantation apparatus shown in FIGS. 1A and 1B.

FIG. 2 is an enlarged schematic diagram illustrating an example of the mechanical scanning device 11 in the hybrid scanning ion implantation apparatus of FIGS. 1A and 1B. As shown in FIG. 2, the mechanical scanning device 11 schematically includes a wafer holder 27, a wafer rotation unit 12, and a wafer lifting unit 13. The ion beam scans by the beam scanner 5 in a direction (beam scanning direction) perpendicular to the figure and is applied to the semiconductor wafer 10 held on the wafer holder 27. The wafer holder 27 is reciprocally driven by the wafer lifting unit 13 in an arrow direction indicated by the broken line in FIG. 2, and, as a result, the semiconductor wafer 10 held on the wafer holder 27 is also reciprocally driven in the arrow direction (the wafer slow scanning direction) indicated by the broken line in FIG. 2. In this way, in the hybrid scanning ion implantation apparatus, ions are implanted into the entire surface of the semiconductor wafer 10 through the beam fast scanning of the ion beam and the wafer slow scanning of the semiconductor wafer 10.

Certain embodiments of the present invention may be applied to the two-dimensional mechanical wafer scanning ion implantation apparatus, and thus a difference from the hybrid scanning ion implantation apparatus will be described briefly with reference to FIGS. 1A, 1B, and 2.

In the two-dimensional mechanical wafer scanning ion implantation apparatus as well, ions generated by the ion source 1 are extracted by the extraction electrode 2 as an ion beam, and the extracted ion beam is transported along a beam line reaching the semiconductor wafer 10. Along the beam line, the mass spectrometry magnet device 3, the mass spectrometry slit 4, and the wafer processing chamber (ion implantation chamber) are disposed; however, the beam scanner 5 and the parallel lenses 6 are omitted. When the beam scanner 5 and the parallel lenses 6 are omitted, a structure of the mechanical scanning device 11 becomes complicated. In other words, the wafer holder 27 is mechanically scanned in a two-dimensional manner along with the semiconductor wafer 10 through an operation in a horizontal direction (a wafer fast scanning direction which is the same as the beam scanning direction) by a wafer horizontal movement unit (not shown) in addition to an operation in a vertical direction (a wafer slow scanning direction) by the wafer lifting unit 13.

Hereinafter, for simplicity of description, the description will be made of a case where certain embodiments of the present invention are mainly applied to the hybrid scanning ion implantation apparatus. In relation to a case where certain embodiments of the present invention are applied to the two-dimensional mechanical wafer scanning ion implantation apparatus, an appropriate comment is given according to necessity of description thereof.

Figure 3:
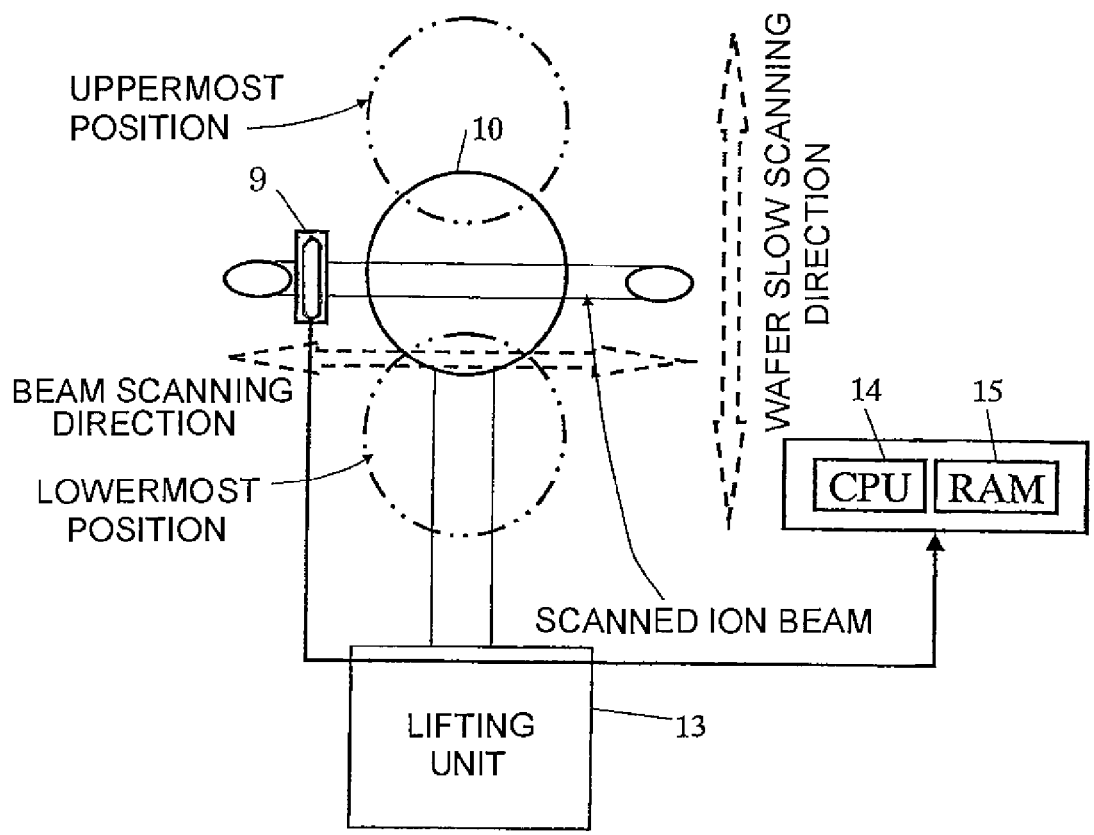
FIG. 3 is a diagram illustrating an ion implantation operation of a hybrid scanning ion implantation apparatus.

With reference to FIG. 3, an operation of the hybrid scanning ion implantation apparatus during ion implantation into the semiconductor wafer 10 will be described further in detail. In FIG. 3, the ion beam scans by the beam scanner 5 in the transverse direction (beam scanning direction). On the other hand, the semiconductor wafer 10 is held by the wafer holder 27 and is scanned (moved) in the vertical (longitudinal) direction (wafer slow scanning direction) by the wafer lifting unit 13 (FIG. 2). In FIG. 3, an operation of the hybrid scanning ion implantation apparatus is described by indicating the uppermost position and the lowermost position of the semiconductor wafer 10 with the two-dot chain line. FIG. 3 shows a case where the ion beam of which a cross-sectional shape is transversely long (that is, an elliptical shape) scans by the beam scanner 5 (FIGS. 1A and 1B) and is applied to the semiconductor wafer 10 in a state of a scanned ion beam. However, generally, an ion beam for the scanning is not limited to an ion beam of which a cross-sectional shape is transversely long as shown in FIG. 3, and there are cases where a cross-sectional shape thereof is longitudinally long or is similar to a circular shape.

As described above, in semiconductor manufacturing processes, as long as there is no particular reason otherwise, it is necessary to secure wafer in-surface uniformity of an ion implantation amount in order to manufacture semiconductor devices with the same quality (characteristics) in a wafer surface. In order to secure wafer in-surface uniformity of an ion implantation amount, first, ions are required to be implanted into the entire surface of the semiconductor wafer 10.

In order to implant ions into the entire surface of the semiconductor wafer 10, a scanning range of the scanned ion beam is required to exceed the area range of the semiconductor wafer 10. However, although described later in detail, the above-described limitation does not mean that a scanning range (beam scanning length) of the scanned ion beam is necessarily larger than the diameter of the semiconductor wafer 10 at all times.

In addition, in order to implant ions into the entire surface of the semiconductor wafer 10, a scanning range (movement range) of the semiconductor wafer 10 in the wafer slow scanning direction is required to exceed the diameter of the semiconductor wafer 10.

According to the limitations on a scanning range, it is possible to implant ions into the entire surface of the semiconductor wafer 10. However, wafer in-surface uniformity of an ion implantation amount is not secured only with the limitations on a scanning range. In other words, in the scanning range, ion implantation amount uniformity in the beam scanning direction and ion implantation amount uniformity in the wafer slow scanning direction are required to be secured such that an ion implantation amount per unit area of the semiconductor wafer 10 is constant.

In the hybrid scanning ion implantation apparatus, a scanned ion beam is measured before ion implantation by using the wafer region beam measurement device 9 as necessary, and, ion implantation amount uniformity in the beam scanning direction is secured by minutely adjusting the beam scanner 5 as necessary. In relation to ion implantation amount uniformity in the wafer slow scanning direction, in a case where a beam variation does not occur, ion implantation amount uniformity is secured by scanning the semiconductor wafer 10 at the same speed using the mechanical scanning device 11. By securing the two-dimensional (the beam scanning direction and the wafer slow scanning direction) ion implantation amount uniformity, the wafer in-surface uniformity of an ion implantation amount is secured.

However, in practice, there are cases where, if the semiconductor wafer 10 is scanned (moved) at the same speed, the wafer in-surface uniformity of an ion implantation amount cannot be secured. For example, there are cases where a slight beam variation occurs in the hybrid scanning ion implantation apparatus. In these cases, if the semiconductor wafer 10 is scanned (moved) at the same speed, the wafer in-surface uniformity of an ion implantation amount cannot be secured. In addition, for example, if ions are implanted into the semiconductor wafer 10 in the semiconductor manufacturing processes, gases are generated from a thin film which is called a resist film formed on the surface of the semiconductor wafer 10, and impinge on ions which are to be implanted into the semiconductor wafer 10, thereby varying an implantation amount of ions arriving at the semiconductor wafer. If the semiconductor wafer 10 is scanned (moved) at the same speed even in this case, the wafer in-surface uniformity of an ion implantation amount cannot be secured. In addition, for example, there are cases where, in the hybrid scanning ion implantation apparatus, discharge occurs in the beam transport equipment from the ion source to the semiconductor wafer, and thereby ions do not arrive at the semiconductor wafer. If the semiconductor wafer 10 is scanned (moved) at the same speed even in this case, the wafer in-surface uniformity of an ion implantation amount cannot be secured. Hereinafter, the above-described cases are collectively referred to as an abnormal implantation state in some cases.

In relation to wafer in-surface uniformity reduction of an ion implantation amount due to the abnormal implantation state (hereinafter, abbreviated to wafer in-surface uniformity reduction), a frequency thereof or an extent of influence on performance of a final semiconductor device is different depending on ion implantation conditions, and thus handling of this is not necessarily performed. However, conversely speaking, in many cases, handling of the wafer in-surface uniformity reduction is required. In these cases, it is important that an ion current amount during the ion implantation be measured so as to handle this factor, and the mechanical scanning device 11 be appropriately controlled so as to control a wafer slow scanning speed of the semiconductor wafer 10, thereby securing the wafer in-surface uniformity of an ion implantation amount.

Therefore, the hybrid scanning ion implantation apparatus according to the embodiment of the present invention has a structure for controlling the wafer slow scanning speed of the semiconductor wafer 10. Specifically, the mechanical scanning device 11 includes a CPU (Central Processing Unit) (controller) 14 which performs control, and a RAM (Random Access Memory) 15 which stores positions of the semiconductor wafer 10 in the vertical direction (the wafer slow scanning direction). The wafer lifting unit 13 has a function (position measurement unit) of measuring positions of the semiconductor wafer 10 in the vertical direction (the wafer slow scanning direction). The CPU 14 receives information indicating a position of the semiconductor wafer 10 in the vertical direction from the wafer lifting unit 13 so as to be stored in the RAM 15. An ion current amount during the ion implantation is measured by the implantation-in-progress beam measurement device 8 and is sent to the CPU 14. The CPU 14 reads a position of the semiconductor wafer 10 in the wafer slow scanning direction stored in the RAM 15 as necessary, and appropriately controls the wafer slow scanning speed of the semiconductor wafer 10 so as to be suitable for the measured ion current amount.

A detailed control method of the mechanical scanning device 11 is different depending on an absolute value of a beam current amount measured by the implantation-in-progress beam measurement device 8 or an extent of temporal variations thereof. For example, in a case where a slight beam variation occurs in the hybrid scanning ion implantation apparatus, the CPU 14 performs control such that the wafer in-surface uniformity of an ion implantation amount can be secured by continuously changing the wafer slow scanning speed of the semiconductor wafer 10 so as to slowly correspond to the beam variation.

In addition, for example, in a case where discharge occurs in the beam transport equipment from the ion source to the semiconductor wafer and thus ions do not arrive at the semiconductor wafer, the CPU 14 performs the following control. The CPU 14 temporarily stops the wafer slow scanning of the semiconductor wafer 10. Further, after the discharge in the beam transport equipment is removed, the CPU 14 reads a position of the semiconductor wafer 10 in the wafer slow scanning direction stored in the RAM 15 immediately before stopping the wafer slow scanning and starts the ion implantation from the read position again. Thereby, the wafer in-surface uniformity of an ion implantation amount is secured.

Figure 11:
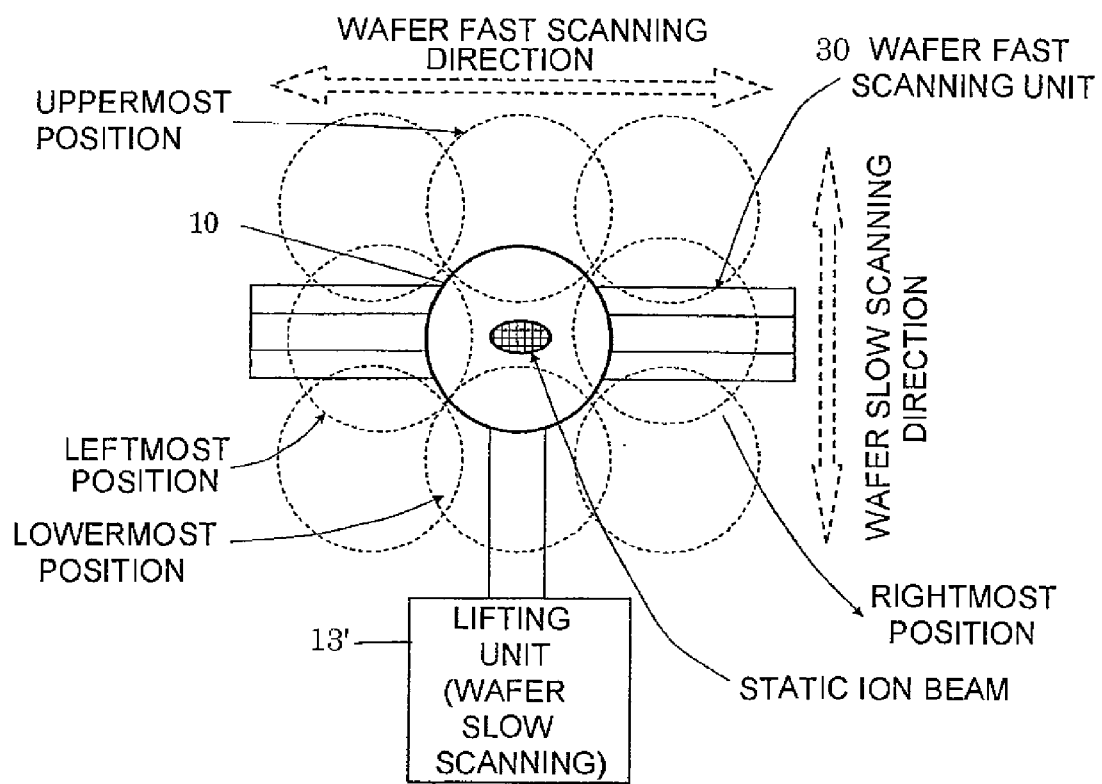
FIG. 11 is a schematic diagram illustrating a mechanical scanning device in the two-dimensional mechanical wafer scanning ion implantation apparatus.
Figure 12:
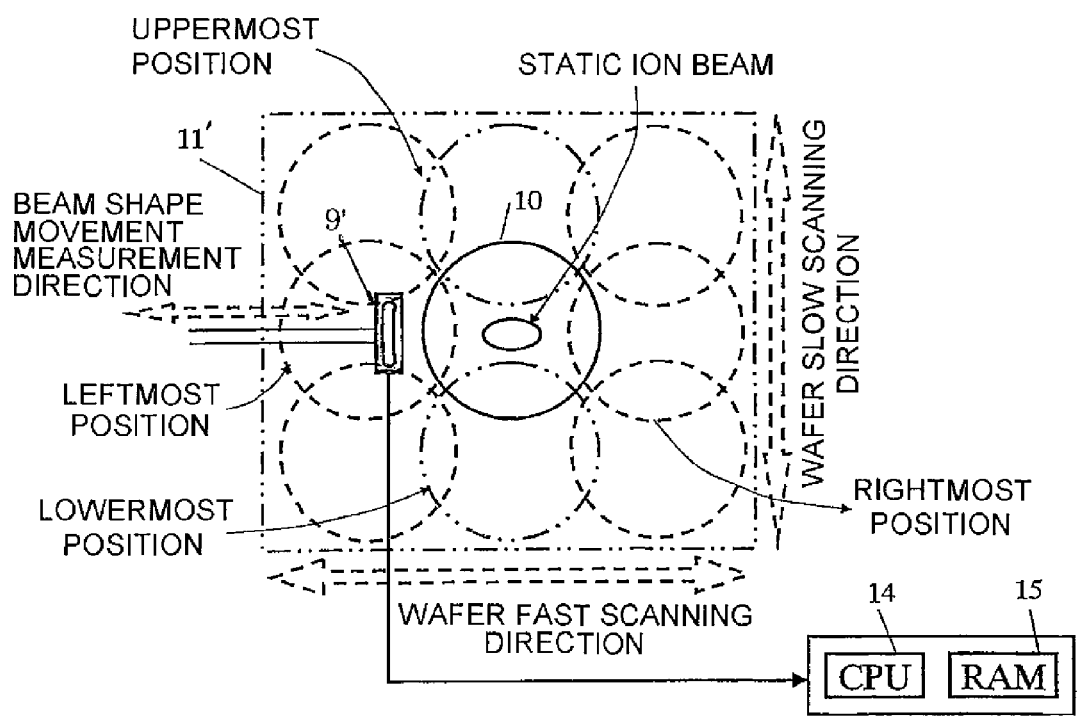
FIG. 12 is a diagram illustrating an ion implantation operation of the two-dimensional mechanical wafer scanning ion implantation apparatus.

The description of the scanning range hitherto is also substantially conceptually established for the two-dimensional mechanical wafer scanning ion implantation apparatus. This will be described briefly with reference to FIGS. 11 and 12. In FIGS. 11 and 12, in a mechanical scanning device 11' of the two-dimensional mechanical wafer scanning ion implantation apparatus, an irradiation position of an ion beam is fixed, and is shown as a static ion beam. In the mechanical scanning device 11', a wafer fast scanning unit 30 is driven by a wafer lifting unit 13' in the vertical direction, that is, the wafer slow scanning direction. In the wafer fast scanning unit 30, a wafer holder (not shown) is driven in the transverse direction, that is, in the wafer fast scanning direction, in a state of holding the semiconductor wafer 10. By a combination of the wafer slow scanning and the wafer fast scanning, the semiconductor wafer 10 reciprocates between the uppermost position and the lowermost position indicated by the broken line shown in FIG. 11 in the wafer slow scanning direction, and reciprocates between the rightmost position and the leftmost position indicated by the broken line in FIG. 11 in the wafer fast scanning direction. As described later, the range between the uppermost position and the lowermost position of the semiconductor wafer 10 corresponds to a wafer slow scanning length shown in FIG. 4, and the range between the rightmost position and the leftmost position corresponds to a beam scanning length shown in FIG. 4. As shown in FIG. 12, the ion beam shown as a static ion beam is in a static state, and a movable type beam measurement device 9' is moved to a position indicated by the static ion beam and performs measurement as necessary.

However, when a beam fast scanning speed of an ion beam is compared with a wafer slow scanning speed for mechanically scanning (moving) the semiconductor wafer in the hybrid scanning ion implantation apparatus, the beam fast scanning speed of an ion beam is larger in many cases. This indicates that, in many cases, a measurement interval of an ion current amount during the ion implantation is lengthened in the two-dimensional mechanical wafer scanning ion implantation apparatus as compared with in the hybrid scanning ion implantation apparatus. Therefore, attention is required to be paid to the fact that handling of the wafer in-surface uniformity reduction is more difficult in the two-dimensional mechanical wafer scanning ion implantation apparatus.

Figure 4:
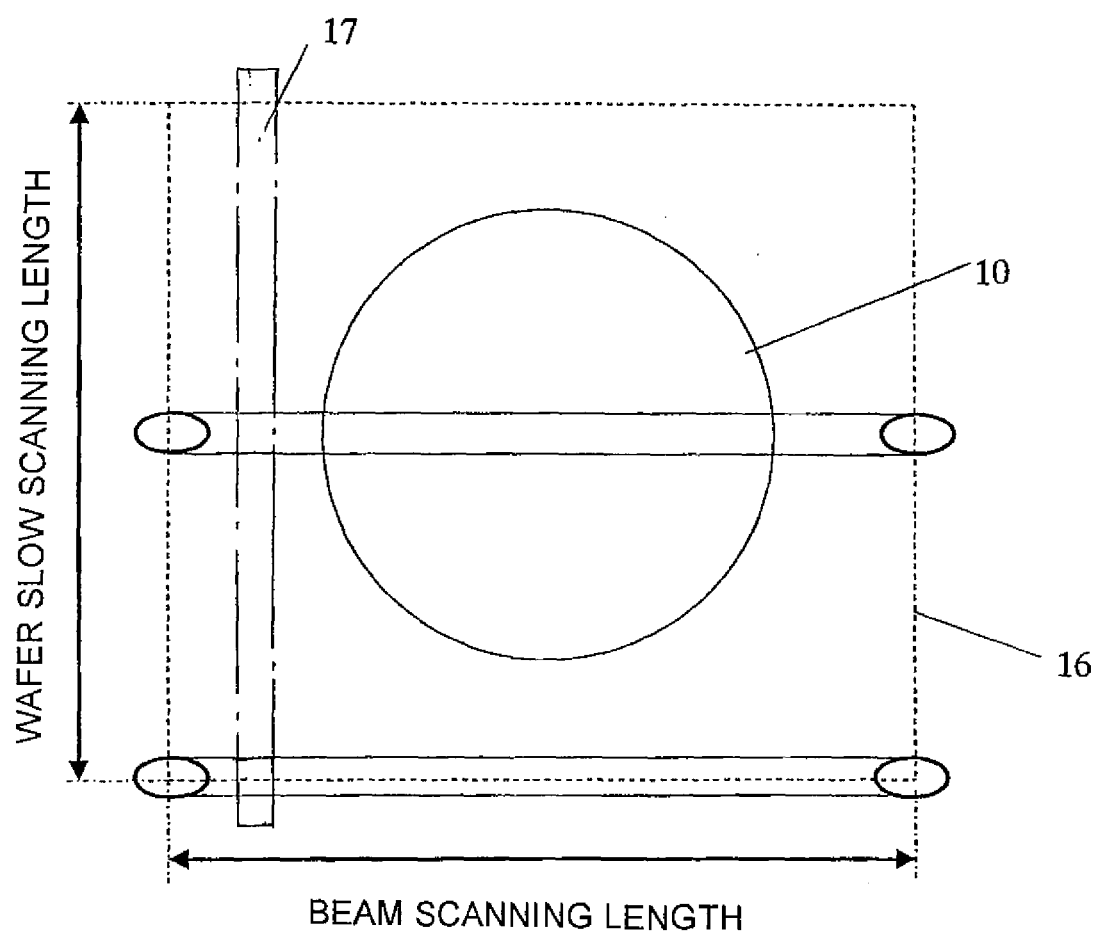
FIG. 4 is a diagram illustrating an example of the typically used ion implantation method.

Here, with reference to FIG. 4, a description will be made of ion implantation performed in the related art in the hybrid scanning ion implantation apparatus. As shown in FIG. 3, in the hybrid scanning ion implantation apparatus according to the embodiment of the present invention, an ion beam scans in the beam scanning direction, and the semiconductor wafer 10 undergoes wafer mechanical slow scanning in the wafer slow scanning direction perpendicular to the beam scanning direction, thereby injecting ions into the semiconductor wafer 10. If ion implantation into the semiconductor wafer 10 is to be considered, a relative movement between an ion beam and the semiconductor wafer 10 is problematic. Therefore, for convenience of understanding, assuming that the semiconductor wafer 10 is static, a virtual implantation and irradiation region (hereinafter, referred to as a virtual implantation and irradiation region 16) of the ion beam may be considered. In other words, the centroid of an ion beam forming a scanned ion beam arrives at the entire virtual implantation and irradiation region 16. The centroid of the ion beam may be considered as being regulated by a central position of the ion beam cross section in the longitudinal direction and transverse direction. In addition, the boundary lines of the virtual implantation and irradiation region 16 may be regarded as limiting lines in the vertical direction and the horizontal direction, at which the centroid of the ion beam forming a scanned ion beam arrives. In FIG. 4, the range regulated by the upper and lower limiting lines in the vertical direction, that is, the wafer slow scanning direction is shown as a wafer slow scanning length, and the range regulated by the left and right limiting lines in the horizontal direction, that is, the beam scanning direction is shown as a beam scanning length. This is also the same for FIGS. 5 to 10 described later. In addition, in a case where the semiconductor wafer 10 is considered to be static, the implantation-in-progress beam measurement device 8 may be assumed to be present in a region delayed in the wafer slow scanning direction as indicated by the dot chain line in FIG.

4. Therefore, hereinafter, this virtual measurement device is referred to as a virtual implantation-in-progress beam measurement device 17.

In ion implantation of the hybrid scanning on implantation apparatus, the semiconductor wafer 10 is practically mechanically scanned (moved) in the wafer slow scanning direction. However, if the semiconductor wafer 10 is assumed to be static as in FIG. 4, and an item for high efficiency ion implantation into the semiconductor wafer 10 is to be considered, attention may be paid to the area of the virtual implantation and irradiation region 16. In other words, the small area of the virtual implantation and irradiation region 16 means that an ion beam guided to the semiconductor wafer 10 is used efficiently in the hybrid scanning ion implantation apparatus. This corresponds to the fact that wafer productivity is improved. Hereinafter, a description will be made paying attention to the area of the virtual implantation and irradiation region 16.

As described above, in relation to wafer in-surface uniformity reduction, a frequency thereof or an extent of influence on performance of a final semiconductor device is different depending on ion implantation conditions, and thus handling of this is not necessarily performed. However, in an ion implantation condition where handling of deterioration in wafer in-surface uniformity of an ion implantation amount is required, it is important to measure an ion current amount using the implantation-in-progress beam measurement device 8 during the ion implantation into the semiconductor wafer 10 in order to handle a factor which impedes the wafer in-surface uniformity of an on implantation amount and to secure the wafer in-surface uniformity of an ion implantation amount. If the semiconductor wafer 10 is assumed to be static as in FIG. 4, and the virtual implantation and irradiation region 16 of an ion beam is to be considered, a scanned ion beam is required to arrive up to a position of the virtual implantation-in-progress beam measurement device 17 during the ion implantation into the semiconductor wafer 10.

Figure 5:
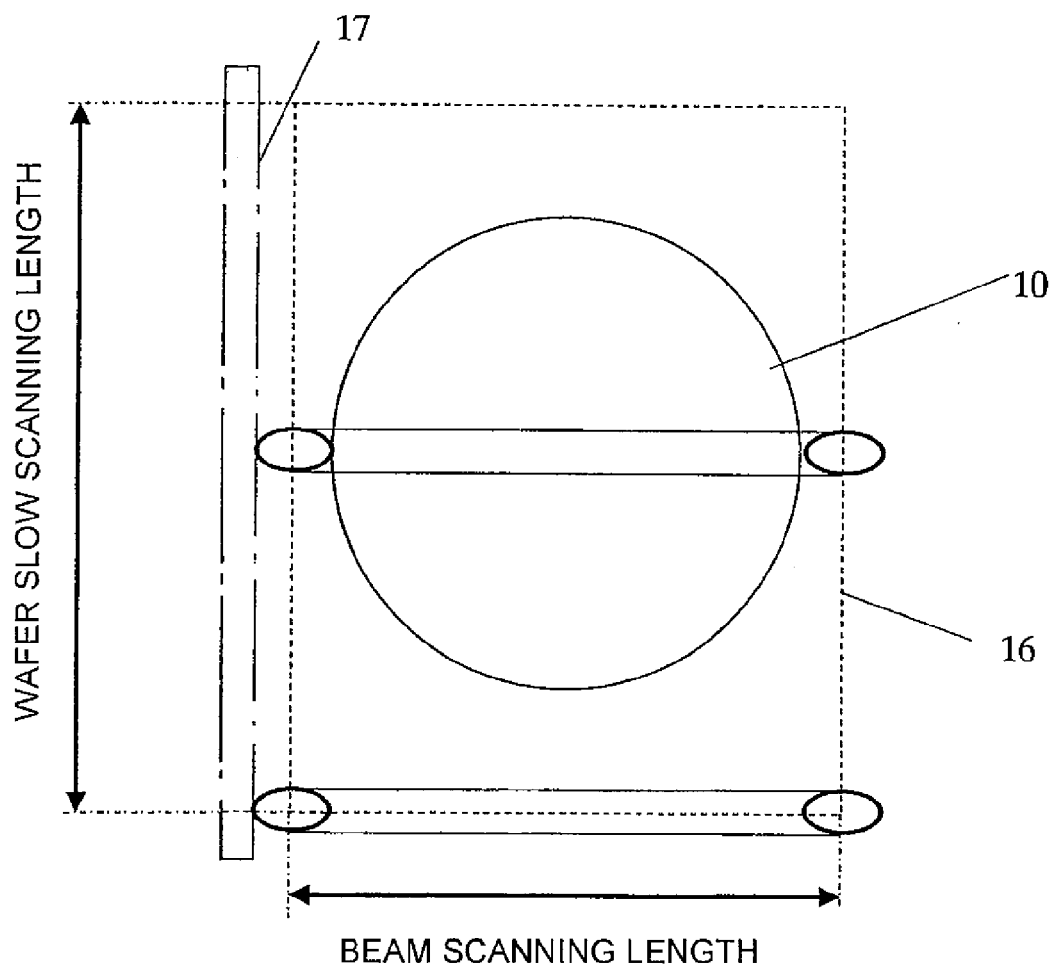
FIG. 5 is a diagram illustrating another example of the typically used ion implantation method.

Here, with reference to FIG. 5, a description will be made of ion implantation performed in the related art by the hybrid scanning ion implantation apparatus in a case where wafer in-surface uniformity reduction is not required to be handled. FIG. 5 shows an example of the virtual implantation and irradiation region 16 of an ion beam. In this case, since an ion current amount is not required to be measured during the ion implantation into the semiconductor wafer 10, a position of the virtual implantation-in-progress beam measurement device 17 has no relation when the virtual implantation and irradiation region 16 of an ion beam is considered. Therefore, in discussion, a position of the virtual implantation-in-progress beam measurement device 17 may be disregarded.

As shown in FIGS. 4 and 5, in the ion implantation performed in the related art by the hybrid scanning ion implantation apparatus, a shape of the virtual implantation and irradiation region 16 is a rectangular shape. Here, since the semiconductor wafer 10 has a circular shape, a wasteful implantation and irradiation region necessarily occurs in the virtual implantation and irradiation region 16. Therefore, it is possible to improve wafer productivity by excluding the wasteful implantation and irradiation region as long as there is no other necessity.

As is clear from the above description, in order to secure wafer in-surface uniformity of an ion implantation amount and improve wafer productivity in the hybrid scanning ion implantation apparatus, as shown in FIGS. 4 and 5, the semiconductor wafer 10 is static, thus the virtual implantation and irradiation region 16 of an ion beam is considered, and the area of the virtual implantation and irradiation region 16 may be as small as possible. Here, needless to say, there is a difference between minimized areas of the virtual implantation and irradiation region 16 in cases where handling of wafer in-surface uniformity reduction is required and is not required. In other words, in a case where handling of wafer in-surface uniformity reduction is not required, it is not necessary to measure an ion current amount during the ion implantation into the semiconductor wafer 10, and, in discussion, a position of the virtual implantation-in-progress beam measurement device 17 can be disregarded. However, in a case where handling of wafer in-surface uniformity reduction is required, it is necessary to measure an ion current amount during the ion implantation into the semiconductor wafer 10, and thus a position of the virtual implantation-in-progress beam measurement device 17 cannot be disregarded. This means that the minimized area of the virtual implantation and irradiation region 16 or a shape thereof is different depending on whether or not handling of wafer in-surface uniformity reduction is required.

Hereinafter, first, minimization of the virtual implantation and irradiation region 16 according to the embodiment of the present invention will be discussed in relation to a case where handling of wafer in-surface uniformity reduction is not required. Then, minimization of the virtual implantation and irradiation region 16 according to the embodiment of the present invention will be discussed in relation to a case where handling of deterioration in wafer in-surface uniformity of an ion implantation amount due to abnormal phenomena is required.

In addition, the description of the virtual implantation and irradiation region is also conceptually established for the two-dimensional mechanical wafer scanning ion implantation apparatus.

Here, with reference to FIG. 6, a description will be made of an ion implantation method according to the embodiment of the present invention in a case where handling of wafer in-surface uniformity reduction is not required. In the embodiment of the present invention, a two-dimensional beam shape (cross-sectional shape of an ion beam) on the wafer plane, measured before ion implantation into the semiconductor wafer 10, is made to be similar to an elliptical shape, and a shape of the boundary line of the virtual implantation and irradiation region 16 is a curved shape regulated by the common tangent of the outer circumference of the elliptical beam and the outer circumference of the circular wafer. In other words, as in FIG. 6, in a case where the semiconductor wafer 10 is assumed to be static, and a virtual implantation and irradiation region of an ion beam is considered, a limiting line at which the centroid of the ion beam arrives is defined as follows. That is to say, a position of the limiting line at which the centroid of the ion beam forming a scanned ion beam is defined such that the scanned ion beam necessarily cuts across the semiconductor wafer 10, and regions other than the semiconductor wafer 10 are not wastefully irradiated with the scanned ion beam, according to each position of the semiconductor wafer 10 in a direction perpendicular to the beam scanning direction. In addition, control is performed such that a scanning terminal end position of the scanned ion beam is placed at the defined position of the limiting line. This limiting line which is expressed mathematically has a curved shape regulated by the common tangent of the outer circumference of the elliptical beam and the circular wafer.

An embodiment of the present invention relates to the hybrid scanning ion implantation apparatus. In this case, in practice, an ion beam scans in the beam scanning direction, and the semiconductor wafer 10 is mechanically scanned (moved) in the wafer slow scanning direction perpendicular to the beam scanning direction, thereby injecting ions into the semiconductor wafer 10. Therefore, in a control method according to the embodiment of the present invention, a set value of a scanning terminal end position of the scanned ion beam is changed using the CPU 14 and the RAM 15, depending on a wafer scanning position in the wafer slow scanning direction of the semiconductor wafer 10.

In the ion implantation method according to the embodiment of the present invention, in order to secure wafer in-surface uniformity of an ion implantation amount and improve wafer productivity, one of features of the present invention is that the virtual implantation and irradiation region 16 of an ion beam is integrally considered in a case where the semiconductor wafer 10 is assumed to be static. In other words, in the hybrid scanning ion implantation apparatus, as described above, in practice, an ion beam scans in the beam scanning direction, and the semiconductor wafer 10 is mechanically scanned (moved) in the wafer slow scanning direction perpendicular to the beam scanning direction. In the ion implantation method according to the embodiment of the present invention, these two scanning directions which are seemingly different are integrally taken into consideration, and thereby a scanning range is integrally controlled such that the virtual implantation and irradiation region 16 is minimized and wafer productivity is improved. Although described later in detail, if the boundary line of the virtual implantation and irradiation region 16 is fixed as an arc, this integrity is impeded, thus control of the hybrid scanning ion implantation apparatus is difficult, and, thereby, the effect of improving wafer productivity is reduced.

Figure 6:
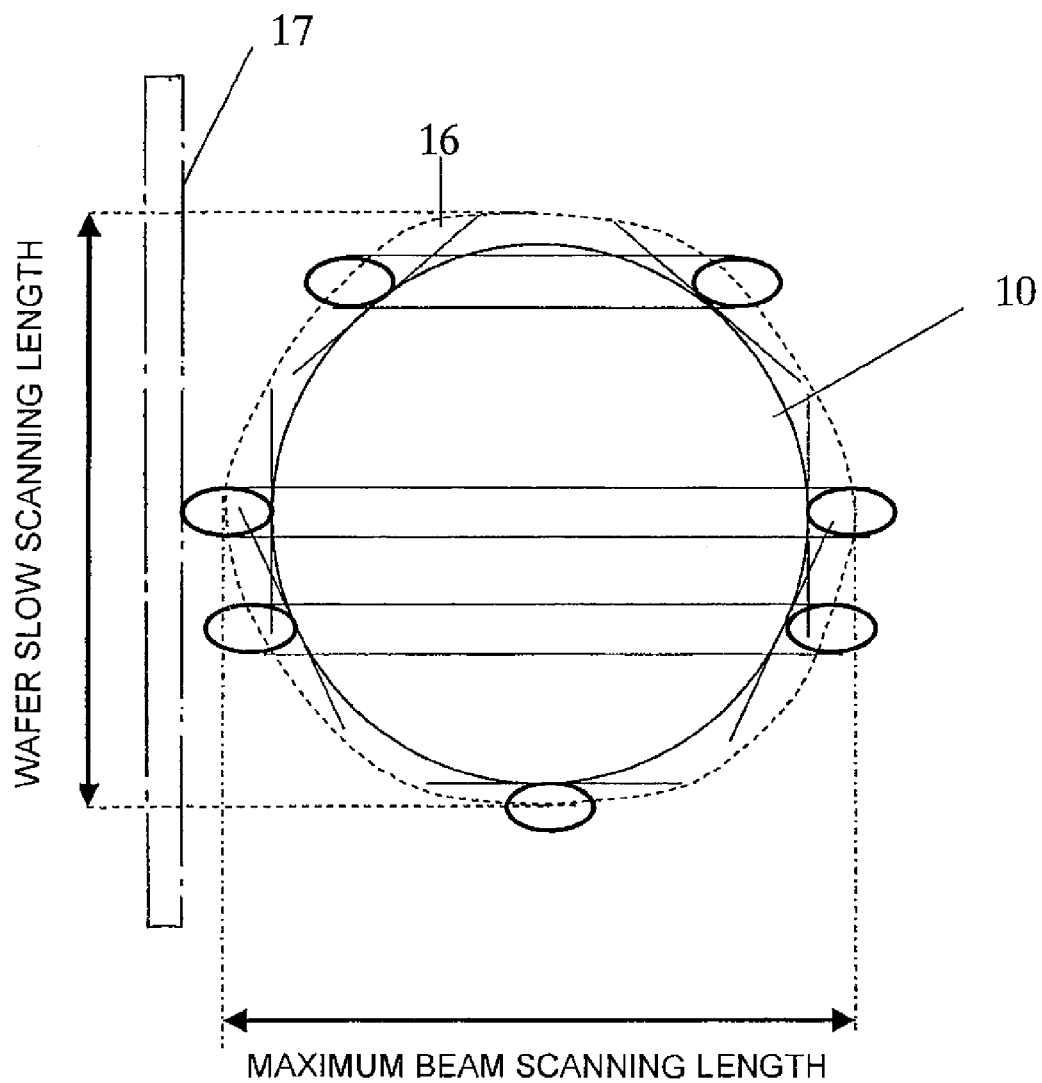
FIG. 6 is a diagram illustrating an example of the ion implantation according to an embodiment of the present invention.

The boundary line of the virtual implantation and irradiation region 16 shown in FIG. 6 is similar to the arc but is not the arc itself. On the contrary, a shape of the boundary line of the virtual implantation and irradiation region 16 which is an arc is not desirable. In addition, since a two-dimensional beam shape (cross-sectional shape) on the wafer plane is made to be similar to an elliptical shape, and the boundary line of the virtual implantation and irradiation region 16 shown in FIG. 6 is regulated by the common tangent of the outer circumference of the elliptical beam and the outer circumference of the circular wafer, a shape thereof is different depending on two-dimensional shapes on the wafer plane. In addition, the beam scanning length (the length in a scanning range of the scanned ion beam) also has features to be pointed out. These features are common features to the ion implantation method according to the embodiment of the present invention and will be thus described again when minimization of the virtual implantation and irradiation region 16 according to the embodiment of the present invention is discussed in a case where handling of wafer in-surface uniformity reduction is required.

In addition, the fact that the boundary line of the virtual implantation and irradiation region 16 regulated by the common tangent of the outer circumference of the elliptical beam and the outer circumference of the circular wafer has not to be an arc is also conceptually established for the two-dimensional mechanical wafer scanning ion implantation apparatus.

Next, with reference to FIG. 7, a description will be made of an ion implantation method according to an embodiment of the present invention where handling of wafer in-surface uniformity reduction is required in a case where certain embodiments of the present invention are applied to the hybrid scanning ion implantation apparatus. As described above, in a case where handling of wafer in-surface uniformity reduction is required, it is important to measure an ion current amount using the implantation-in-progress beam measurement device 8 during the ion implantation into the semiconductor wafer 10 in order to handle a factor which impedes the wafer in-surface uniformity of an ion implantation amount and to secure the wafer in-surface uniformity of an ion implantation amount. Therefore, if the semiconductor wafer 10 is assumed to be static and the virtual implantation and irradiation region 16 of an ion beam is to be considered, a scanned ion beam is required to arrive up to a position of the virtual implantation-in-progress beam measurement device 17 during the ion implantation into the semiconductor wafer 10. In other words, as shown in FIG. 6, in a shape or a setting method of the virtual implantation and irradiation region 16 in a case where handling of the wafer in-surface uniformity reduction is not required, a scanned ion beam does not arrive up to a position of the virtual implantation-in-progress beam measurement device 17, and thus this is not appropriate for an ion implantation method in a case where handling of wafer in-surface uniformity reduction is required.

However, a limiting line at which the centroid of an on beam for improving productivity of ion implantation arrives surely has a curved shape regulated by the common tangent of the outer circumference of the elliptical beam and the outer circumference of the circular wafer. Therefore, as a shape or a setting method of the virtual implantation and irradiation region 16 of an ion beam in a case where handling of wafer in-surface uniformity reduction is required, under a condition where a scanned ion beam arrives up to a position of the virtual implantation-in-progress beam measurement device 17 during the ion implantation into the semiconductor wafer 10, a limiting line at which the centroid of an ion beam of the virtual implantation and irradiation region 16 other than the purpose may be a curved shape regulated by the common tangent of the outer circumference of the elliptical beam and the outer circumference of the circular wafer. A shape of the virtual implantation and irradiation region 16 satisfying this condition is the shape of the virtual implantation and irradiation region 16 indicated by the broken line in FIG. 7.

Here, a shape of the virtual implantation and irradiation region 16 shown in FIG. 7 will be described further in detail. First, an implantation and irradiation region in the beam scanning direction will be described. In the embodiment of the present invention, with respect to the semiconductor wafer 10, an implantation and irradiation region on the side where the implantation-in-progress beam measurement device 8 is disposed uses the same implantation and irradiation region as in ion implantation which is typically favorably used. in FIG. 7 drawn as if the semiconductor wafer 10 is static, an implantation and irradiation region on the side (the left side of the figure) where the virtual implantation-in-progress beam measurement device 17 is disposed has a pseudo-rectangular shape, and this indicates the same on implantation as ion implantation which is typically favorably used. Thereby, an ion current amount is measured by the implantation-in-progress beam measurement device 8 at all times during the ion implantation as well. Therefore, a factor which impedes wafer in-surface uniformity of an ion implantation amount is handled and the wafer in-surface uniformity of an ion implantation amount is secured. In relation to an implantation and irradiation region on the side (the right side of the figure) where the virtual implantation-in-progress beam measurement device 8 is not disposed with respect to the semiconductor wafer 10, as described with reference to FIG. 6, a two-dimensional beam shape on the wafer plane, measured before ion implantation into the semiconductor wafer 10, is made to be similar to a cross-sectional elliptical shape, and a shape of the boundary line thereof is a curved shape regulated by the common tangent of the outer circumference of the elliptical beam and the outer circumference of the circular wafer.

Figure 7:
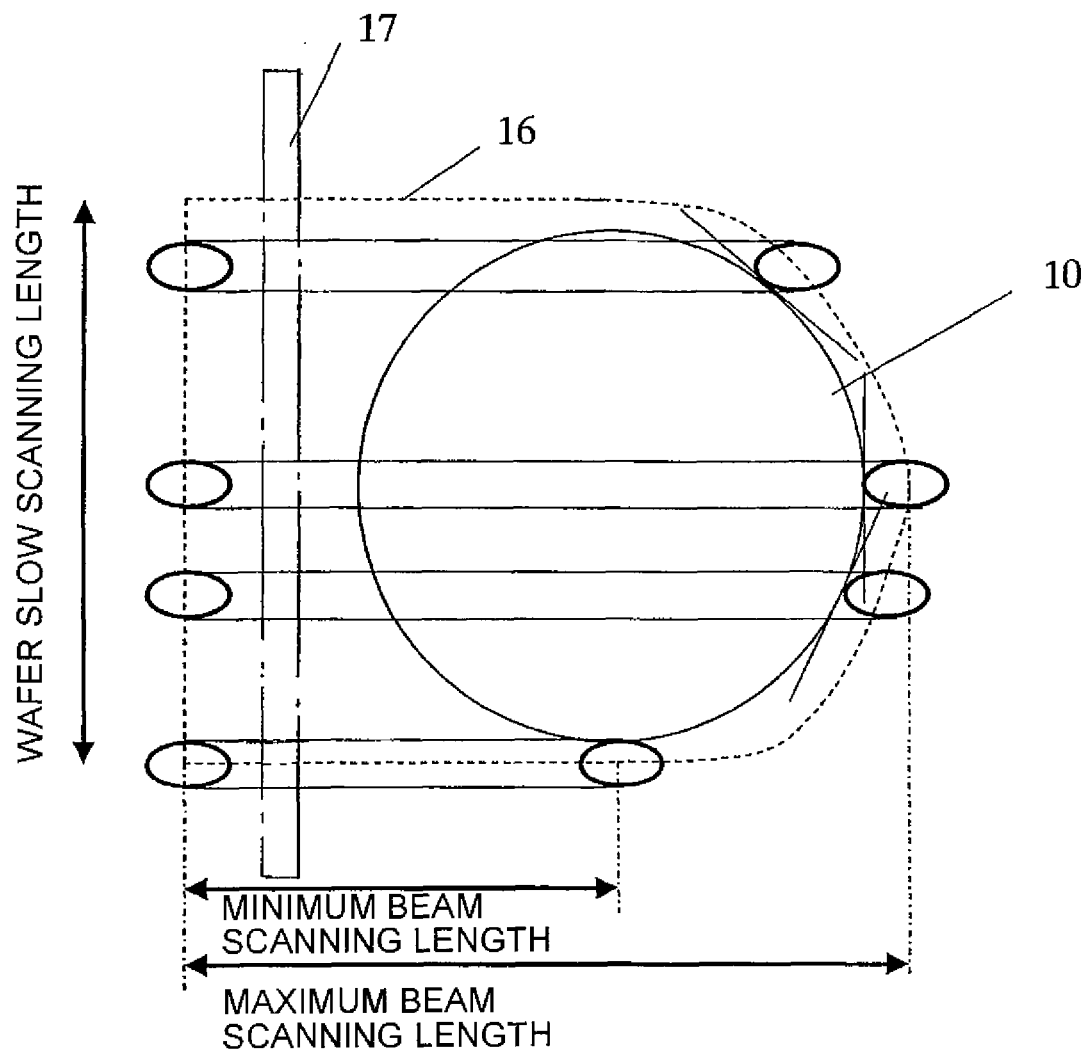
FIG. 7 is a diagram illustrating another example of the ion implantation according to an embodiment of the present invention.

In a shape of the virtual implantation and irradiation region 16 of FIG. 7, in relation to an implantation and irradiation region in the wafer slow scanning direction as well, a limiting line at which the centroid of an ion beam arrives is regulated by the common tangent of the outer circumference of the elliptical beam and the outer circumference of the circular wafer such that a scanned ion beam necessarily cuts across the semiconductor wafer 10. Here, since the scanned ion beam is used, the common tangent of the wafer outer circumferential shape in the wafer slow scanning direction is necessarily parallel to the beam scanning direction. In practice, since an on beam scans in the beam scanning direction, and the semiconductor wafer 10 is mechanically scanned (moved) in the wafer slow scanning direction perpendicular to the beam scanning direction, thereby injecting ions into the semiconductor wafer 10, as a control method according to the embodiment of the present invention, two scanning terminal end positions in the wafer slow scanning direction of the scanned ion beam are regulated using the CPU 14 and the RAM 15, and thereby an implantation and irradiation region in the wafer slow scanning direction is regulated.

As described above, in order to implant ions into the entire surface of the semiconductor wafer 10, a scanning range of the scanned ion beam is required to exceed the range of the semiconductor wafer 10. However, the above-described limitation does not mean that a scanning range (beam scanning length) of the scanned ion beam is necessarily larger than the diameter of the semiconductor wafer 10 at all times, and, as is clear from FIG. 7, in the ion implantation according to the embodiment of the present invention, a scanning terminal end position of the minimum beam scanning length lies in the range of the semiconductor wafer 10 as compared with the wafer diameter of the central position in the wafer slow scanning direction of the semiconductor wafer 10. However, in the embodiment of the present invention, a scanning range of the scanned ion beam, that is, an irradiation range is controlled depending on a wafer scanning position in the wafer slow scanning direction, and thus at least one of the scanning range of the scanned ion beam may exceed the range of the semiconductor wafer 10 at each wafer scanning position in the wafer slow scanning direction.

Needless to say, the discussion on the scanning range of a scanned ion beam is also the same for the ion implantation method according to the embodiment of the present invention in a case where handling of wafer in-surface uniformity reduction is not required, described with reference to FIG. 6.

In addition, as described above, since handling of the wafer in-surface uniformity reduction is more difficult in the two-dimensional mechanical wafer scanning ion implantation apparatus, the virtual implantation and irradiation region 16 shown in FIG. 6 is used more frequently than the virtual implantation and irradiation region 16 shown in FIG. 7.

Figure 8:
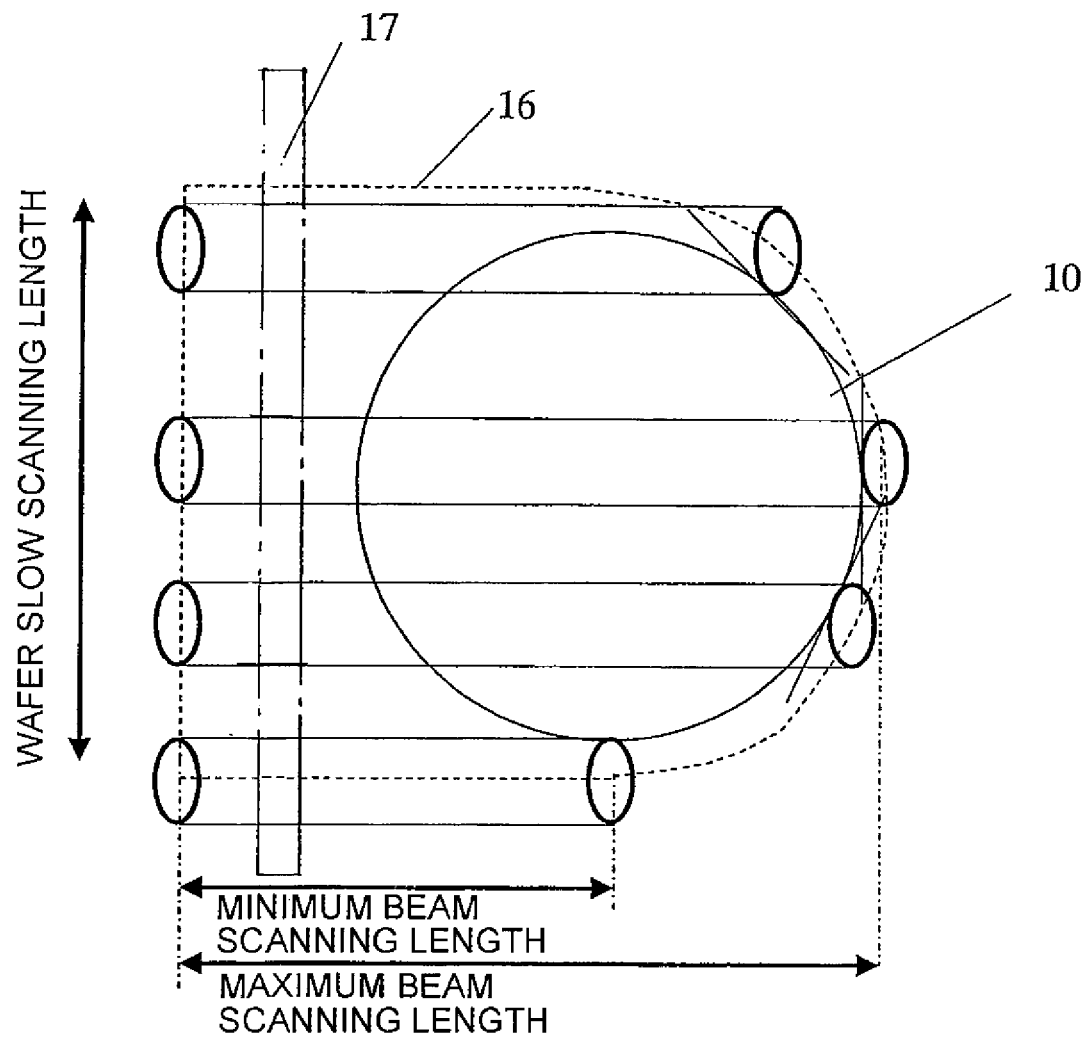
FIG. 8 is a diagram illustrating still another example of the ion implantation according to an embodiment of the present invention.

Next, with reference to FIG. 8, a further detailed description will be made of an ion implantation method according to the embodiment of the present invention when handling of wafer in-surface uniformity reduction is required in a case where certain embodiments of the present invention are applied to the hybrid scanning ion implantation apparatus. In FIGS. 7 and 8, two-dimensional shapes (two-dimensional beam shapes, that is, cross-sectional shapes) of an ion beam forming a scanned ion beam are different. In the embodiment of the present invention, a shape of the boundary line of the virtual implantation and irradiation region 16 is regulated by the common tangent of the outer circumference of the elliptical beam and the outer circumference of the circular wafer, and thus shapes of the virtual implantation and irradiation region 16 are different in FIGS. 7 and 8 where two-dimensional shapes (cross-sectional shapes) of an ion beam are different. This difference is derived from performing control such that a scanned on beam necessarily cuts across the semiconductor wafer 10 and the scanned on beam is not wastefully applied to regions other than the semiconductor wafer 10 in order to improve wafer productivity most. In other words, in a case where a two-dimensional shape of an ion beam forming a scanned ion beam is different, a shape of the virtual implantation and irradiation region 16 is necessarily changed.

As can be seen from the comparison of FIG. 7 with FIG. 8, in FIGS. 7 and 8, both an implantation and irradiation region in the beam scanning direction and an implantation and irradiation region in the wafer slow scanning direction are controlled based on information regarding a beam shape of a scanned ion beam measured before on implantation. Conversely speaking, in the ion implantation method according to the embodiment of the present invention, it can be seen that it is necessary to measure a scanned ion beam in advance before ion implantation and obtain a two-dimensional beam shape in order to improve wafer productivity most.

In addition, generally, in relation to an ion beam forming a scanned ion beam, a two-dimensional shape thereof may vary, and a beam centroid position thereof may vary. In this case, a shape of the boundary line of the virtual implantation and irradiation region 16 does not vary, but control techniques in a practical hybrid scanning ion implantation apparatus are different as described later in detail. In this case as well, a scanned on beam is measured in advance before ion implantation, a two-dimensional beam shape is obtained, and thereby variations in a beam central position are also measured so as to perform handling.

If a boundary line of the virtual implantation and irradiation region 16 is defined without measuring a scanned ion beam before ion implantation into the semiconductor wafer and obtaining a two-dimensional beam shape, it is necessary to perform control by assuming the largest two-dimensional beam shape of conceivable two-dimensional beam shapes. In this case, there is expected to be an improvement in wafer productivity as compared with the typical ion implantation shown in FIG. 4; however, an effect thereof is limited as compared with the effect of improving wafer productivity according to the embodiment of the present invention. Even from this viewpoint, an advantage of the present invention is clear.

In a case where a boundary line of the virtual implantation and irradiation region 16 is defined without measuring a scanned ion beam before ion implantation into the semiconductor wafer 10 and obtaining a two-dimensional beam shape, if control is performed assuming an inappropriate two-dimensional beam shape other than the conceivable largest two-dimensional beam shape, it cannot be said that a scanned ion beam necessarily cuts across the semiconductor wafer 10. In other words, in a case where a practical two-dimensional beam shape is included in the inappropriate two-dimensional beam shape by accident, it can be said that a scanned ion beam necessarily cuts across the semiconductor wafer 10. However, in a case where a practical two-dimensional beam shape is not completely included in the inappropriate two-dimensional beam shape by accident, it cannot be said that a scanned ion beam necessarily cuts across the semiconductor wafer 10. In the latter case, as described above, ions cannot be implanted into the entire surface of the semiconductor wafer 10, which departs from the purpose of the ion implantation apparatus.

As can be easily understood from the above description, the following method according to the embodiment of the present invention is necessary to perform control such that a scanned ion beam necessarily cuts across the semiconductor wafer 10 and regions other than the semiconductor wafer 10 are not wastefully irradiated with the scanned ion beam in order to improve wafer productivity most. In other words, it is necessary that a scanned ion beam be measured in advance before ion implantation, a two-dimensional beam shape be obtained, the two-dimensional beam shape on the wafer plane be made to be similar to an elliptical shape, and a boundary line of the virtual implantation and irradiation region 16 regulated by the common tangent of the outer circumference of the elliptical beam and the outer circumference of the circular wafer be defined.

Needless to say, the fact that the virtual implantation and irradiation region 16 is required to be changed depending on a two-dimensional shape of an ion beam and the discussion on importance of a two-dimensional shape of an ion beam being measured in advance before ion implantation are also the same for the ion implantation method according to the embodiment of the present invention in a case where handling of wafer in-surface uniformity reduction is not required, described with reference to FIG. 6.

In addition, needless to say, the fact that the virtual implantation and irradiation region 16 is required to be changed depending on a two-dimensional shape of an ion beam and the discussion on importance of a two-dimensional shape of an ion beam being measured in advance before ion implantation are also the same for a case where certain embodiments of the present invention are applied to the two-dimensional mechanical wafer scanning ion implantation apparatus.

The reason why it is necessary and important to measure a scanned ion beam in advance before ion implantation into the semiconductor wafer 10 and obtain and use a two-dimensional beam shape in the ion implantation method according to the embodiment of the present invention has been described hitherto. In the ion implantation method according to the embodiment of the present invention, the reason why it is necessary and important to define a boundary line of the virtual implantation and irradiation region 16 regulated by beam information and a common tangent of a wafer outer circumferential shape which are calculated from a measured two-dimensional beam shape and a reference beam position, is also the same. Hereinafter, a detailed description thereof will be made.

Figure 9:
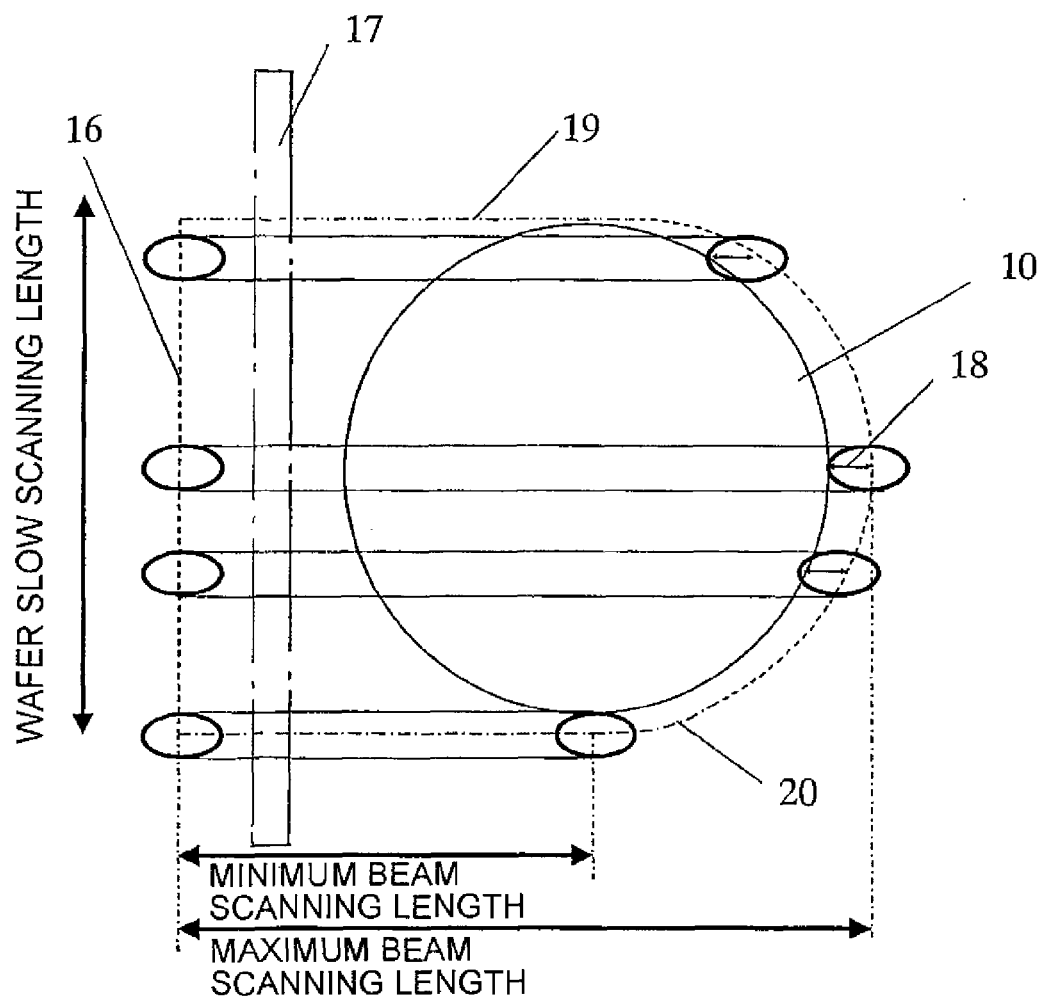
FIG. 9 is a diagram illustrating one of ion implantation methods.

FIG. 9 is a diagram schematically illustrating an ion implantation method when a shape of the boundary line of the virtual implantation and irradiation region 16 is an arc shape when handling of wafer in-surface uniformity reduction is required in a case where certain embodiments of the present invention are applied to the hybrid scanning ion implantation apparatus. This arc shape corresponds to, that is, what a scanning range of the centroid position of the scanned ion beam of a portion exceeding the semiconductor wafer 10 is the same. Hereinafter, the length of this scanning range is referred to as a distance 18 between the virtual arc implantation region and the wafer.

As is clear from FIG. 9, it is assumed that a shape of a boundary line of the virtual implantation and irradiation region 16, regulated in one side of two implantation and irradiation regions divided by a straight line including the wafer diameter in the wafer slow scanning direction, is an arc shape. In this case, for example, even if a boundary line of the virtual implantation and irradiation region 16 is defined such that a scanned ion beam necessarily cuts across the semiconductor wafer 10 at the wafer diameter position of the semiconductor wafer 10 in the beam scanning direction, as is clear from FIG. 9, it cannot be said that the scanned ion beam necessarily cuts across the semiconductor wafer 10 at other positions of the semiconductor wafer 10. In this case, as described above, ions cannot be implanted into the entire surface of the semiconductor wafer 10, which thus departs from the purpose of the ion implantation apparatus. In practice, assuming a case where a two-dimensional beam shape (cross-sectional shape) of the scanned ion beam is sufficiently small, and the two-dimensional beam shape may not be taken into consideration, a boundary line of the virtual implantation and irradiation region 16, regulated by beam information and a common tangent of a wafer outer circumferential shape which are calculated from the two-dimensional beam shape and a reference beam position, has an arc shape. That is to say, a case where a shape of the boundary line of the virtual implantation and irradiation region 16 may be an arc shape is limited to a case where a two-dimensional beam shape of the scanned ion beam is sufficiently small, and such a case does not occur in a practical ion implantation apparatus.

If a shape of the boundary line of the virtual implantation and irradiation region 16 is an arc shape, control is required to be performed such that the scanned ion beam necessarily cuts across the semiconductor wafer 10 in the entire region of the semiconductor wafer 10, by setting the distance 18 between the virtual arc implantation region and the wafer to be sufficiently large. In this case, there is expected to be an improvement in wafer productivity as compared with the typical ion implantation shown in FIG. 4; however, an effect thereof is limited as compared with the effect of improving wafer productivity according to the embodiment of the present invention. Even from this viewpoint, an advantage of the present invention is clear. In addition, in this case, the integral control of a scanning range is impeded as described above, and thus a problem also occurs in the connection between ion implantation control in the beam scanning direction and ion implantation control in the wafer slow scanning direction described later.

As described above, the area of the virtual implantation and irradiation region 16 regulates wafer productivity, and, not only ion implantation control in the beam scanning direction but also ion implantation control in the wafer slow scanning direction is required to be taken into consideration. As described with reference to FIGS. 7 and 8, in the embodiment of the present invention, both an implantation and irradiation region in the beam scanning direction and an implantation and irradiation region in the wafer slow scanning direction are integrally controlled based on information regarding a two-dimensional beam shape of the scanned ion beam which is measured before ion implantation. That is to say, a shape of the boundary line of the virtual implantation and irradiation region 16 is a curved shape or a substantially straight-line shape, integrally regulated by the common tangent of the outer circumference of the elliptical beam and the outer circumference of the circular wafer in both the beam scanning direction and the wafer slow scanning direction.

However, as shown in FIG. 9, in a case where a shape of the boundary line of the virtual implantation and irradiation region 16 is an arc shape, a problem occurs in the connection between the ion implantation control in the beam scanning direction and the ion implantation control in the wafer slow scanning direction. In other words, if the arc of the virtual implantation and irradiation region 16 in the beam scanning direction is maintained at all times, a boundary line of the virtual implantation and irradiation region at the end portions of the semiconductor wafer 10 in the wafer slow scanning direction becomes the boundary line as indicated by the two-dot chain line on the upper part of FIG. 9. Hereinafter, the boundary line indicated by the two-dot chain line is referred to as a wafer end portion boundary line 19 in the wafer slow scanning direction when complete arc control is performed. This means that it cannot be said that a scanned ion beam necessarily cuts across the semiconductor wafer 10 in the wafer slow scanning direction, and thus ions cannot be implanted into the entire surface of the semiconductor wafer 10. That is to say, an ion implantation method itself for defining the wafer end portion boundary line 19 in the wafer slow scanning direction when complete arc control is performed departs from the purpose of the ion implantation apparatus.

In order to realize circumstances where a scanned ion beam necessarily cuts across the semiconductor wafer 10 in the wafer slow scanning direction, a boundary line of the virtual implantation and irradiation region at the end portions of the semiconductor wafer 10 in the wafer slow scanning direction is required to be the boundary line as indicated by the dot chain line on the lower part of FIG. 9. Hereinafter, the boundary line indicated by the dot chain line is referred to as a wafer end portion boundary line 20 in the wafer slow scanning direction when incomplete arc control is performed. Here, it is noted that the wafer end portion boundary line 20 in the wafer slow scanning direction when incomplete arc control is performed is not an arc yet. That is to say, there are a shape regulated as an arc and a shape of the wafer end portion boundary line 20 in the wafer slow scanning direction when incomplete arc control is performed in a shape of the boundary line of the virtual implantation and irradiation region 16, and thus they are required to be connected based on continuous scanning range control. However, in the hybrid scanning ion implantation apparatus, it is very difficult to define which range of the boundary line of the virtual implantation and irradiation region 16 is controlled so as to form an arc and which range is controlled so as to form the wafer end portion boundary line 20 in the wafer slow scanning direction when incomplete arc control is performed, in the wafer slow scanning direction for mechanically scanning (moving) the semiconductor wafer 10. In other words, a problem occurs in the connection between the ion implantation control in the beam scanning direction and the ion implantation control in the wafer slow scanning direction.

From the above description, when a two-dimensional shape of a scanned ion beam in a practical hybrid scanning ion implantation apparatus is taken into consideration, it is clear that a shape of the boundary line of the virtual implantation and irradiation region 16 has not to be an arc shape. Further, according to the embodiment of the present invention, it is also clear that it is necessary and important to make a two-dimensional beam shape on the wafer plane, measured before ion implantation into the semiconductor wafer 10, similar to an elliptical shape, and to define a boundary line of the virtual implantation and irradiation region 16 regulated by the common tangent of the outer circumference of the elliptical beam and the outer circumference of the circular wafer.

Needless to say, the discussion on the defects in a case where a boundary line shape of the virtual implantation and irradiation region 16 is an arc shape is also the same for the ion implantation method according to the embodiment of the present invention in a case where handling of wafer in-surface uniformity reduction is not required, described with reference to FIG. 6.

In addition, the discussion on the defects in a case where a boundary line shape of the virtual implantation and irradiation region 16 is an arc shape will be additionally described in a case where certain embodiments of the present invention are applied to the two-dimensional mechanical wafer scanning ion implantation apparatus. In the two-dimensional mechanical wafer scanning ion implantation apparatus, only ion implantation control in the wafer slow scanning direction can be considered, and thus a problem does not occur in the connection of ion implantation control. However, in the two-dimensional mechanical wafer scanning ion implantation apparatus as well, in a case where a shape of the boundary line of the virtual implantation and irradiation region 16 is an arc shape, control is required to be performed such that an ion beam necessarily cuts across the semiconductor wafer 10 in the entire region of the semiconductor wafer 10, by setting the distance 18 between the virtual arc implantation region and the wafer to be sufficiently large, and thus an effect thereof is limited as compared with the effect of improving wafer productivity according to the embodiment of the present invention. Therefore, an advantage of the present invention is clear.

Hitherto, the description has been made that a shape of the virtual implantation and irradiation region 16 according to the embodiment of the present invention satisfies a demand for securing wafer in-surface uniformity of an ion implantation amount and improving wafer productivity in the hybrid scanning on implantation apparatus and the two-dimensional mechanical wafer scanning ion implantation apparatus. Specifically, an ion beam is measured in advance before ion implantation into the semiconductor wafer 10, a two-dimensional beam shape on the wafer plane is made to be similar to an elliptical shape using the two-dimensional beam shape obtained as a result thereof depending on whether or not handling of wafer in-surface uniformity reduction is required, and a partial or entire shape of the virtual implantation and irradiation region 16 is regulated by the common tangent of the outer circumference of the elliptical beam and the outer circumference of the circular wafer. Thereby, it is possible to secure wafer in-surface uniformity of an ion implantation amount and improve wafer productivity.

Hereinafter, a more detailed description will be made of one of controls according to an embodiment of the present invention for concretely realizing the virtual implantation and irradiation region 16.

Figure 10:
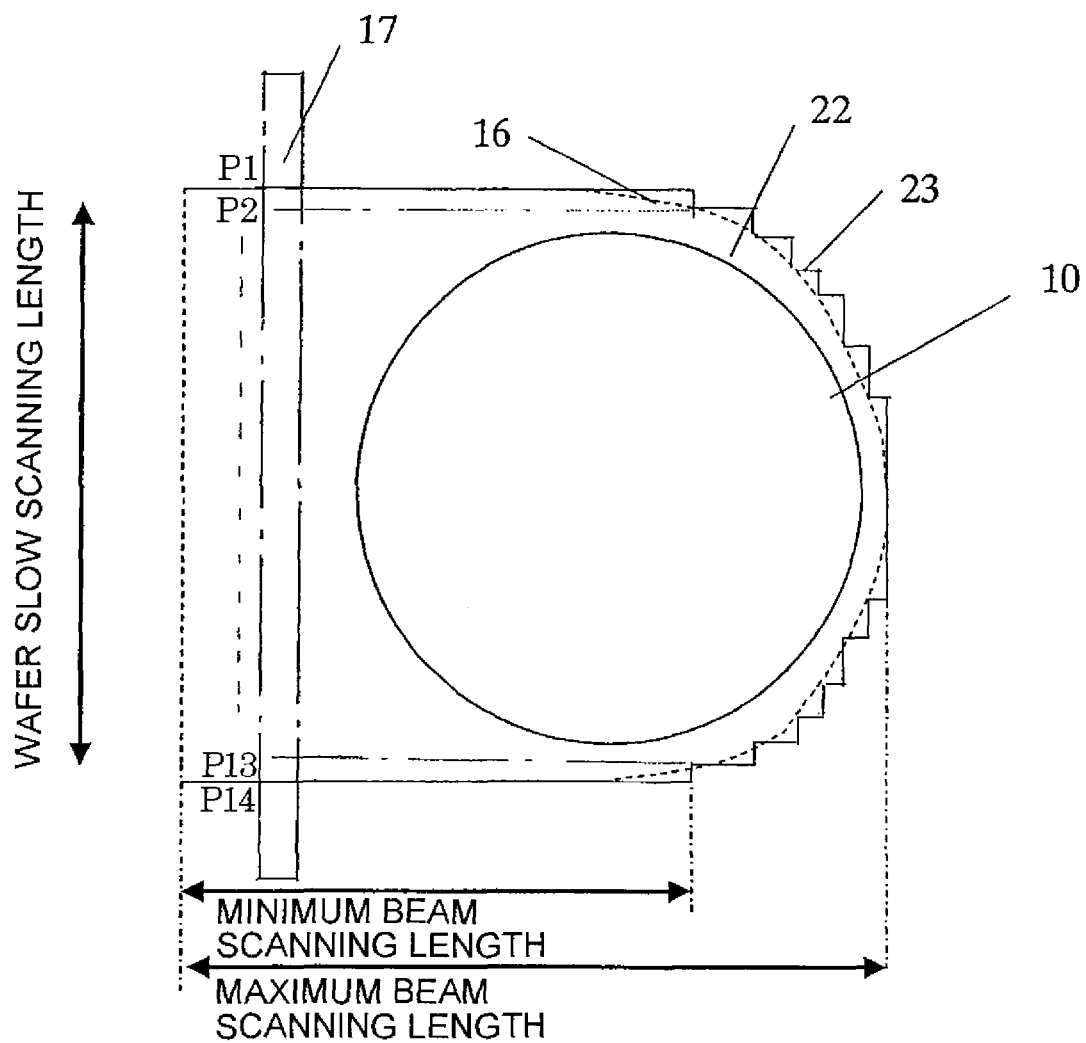
FIG. 10 is a diagram illustrating ion implantation according to an embodiment of the present invention.

Here, with reference to FIG. 10, in a case where certain embodiments of the present invention are applied to the hybrid scanning ion implantation apparatus, a description will be made of control of the hybrid scanning ion implantation apparatus for concretely realizing the virtual implantation and irradiation region 16 according to an embodiment of the present invention when handling of wafer in-surface uniformity reduction is required. In order to realize the virtual implantation and irradiation region 16 described hitherto strictly mathematically, continuous beam scanning length changes are required at a number of times close to infinite steps for each scanning of beam scanning depending on a position of the semiconductor wafer 10 in the mechanical scanning direction. However, as shown in FIG. 10, according to the hybrid scanning ion implantation apparatus in which several beam scanning length changes are bundled and a representative beam scanning length change is performed so as to reduce and simplify the number of changes, thereby performing beam scanning length changes in stages, such mathematical strictness is not necessary. In this hybrid scanning ion implantation apparatus, an implantation and irradiation region which includes the virtual implantation and irradiation region 16 in the inside thereof may be set as a curve which varies in a stepwise shape as shown in FIG. 10. This practical implantation and irradiation region according to the embodiment of the present invention is hereinafter referred to as a productivity improvement virtual implantation and irradiation region 22, and a boundary line of the productivity improvement virtual implantation and irradiation region 22 is hereinafter referred to as a productivity improvement virtual implantation and irradiation region boundary line 23. In other words, the embodiment of the present invention may be also said to be a technique for defining a setting method of the productivity improvement virtual implantation and irradiation region 22.

In the setting of the productivity improvement virtual implantation and irradiation region 22, a plurality of scanning terminal end positions on a side where the beam scanning length is reduced are regulated in stages, and thereby an implantation and irradiation region on the side where the beam scanning length is reduced, that is, the implantation and irradiation region on the upper right side of FIG. 10 is regulated. In FIG. 10, thirteen scanning terminal end positions are regulated, but this is an example, and more scanning terminal end positions than that may be regulated, or less scanning terminal end positions than that may be regulated. However, if there is a single scanning terminal end position, ion implantation is the same as the ion implantation in the typical hybrid scanning ion implantation apparatus described with reference to 4. Therefore, in the embodiment of the present invention, a plurality of scanning terminal end positions are required to be regulated. In addition, as conceptually described with reference to FIGS. 7 and 8, the productivity improvement virtual implantation and irradiation region 22 according to the embodiment of the present invention when handling of wafer in-surface uniformity reduction is required is set as asymmetrical implantation and irradiation regions as is clear from FIG. 10.

As described above, an important factor in setting the productivity improvement virtual implantation and irradiation region 22 is to include the virtual implantation and irradiation region 16 in the inside thereof. In other words, needless to say, a shape of the productivity improvement virtual implantation and irradiation region 22 varies depending on a measured two-dimensional beam shape. Therefore, a plurality of scanning terminal end positions which are set in stages are also set and varied depending on a measured two-dimensional beam shape.

As is clear from the comparison of FIGS. 7 and 8 with FIG. 10, in a case where a plurality of scanning terminal end positions in the implantation and irradiation region of one side which is not a rectangular shape are regulated as in FIG. 10, a scanning terminal end position forming the minimum beam scanning length is not a position corresponding to the center of the semiconductor wafer 10 shown in FIG. 7 or 8.

In addition, as described above, although, in FIG. 10, attention is paid to the relative movement between an ion beam and the semiconductor wafer 10, and the virtual implantation and irradiation region 16 is considered assuming that the semiconductor wafer 10 is static for convenience of understanding, in practice, the semiconductor wafer 10 is mechanically scanned (moved) in the hybrid scanning ion implantation apparatus. Therefore, the ion implantation circumstances in FIG. 10 correspond to changing set values of a plurality of set scanning terminal end positions according to wafer scanning positions in the wafer slow scanning direction in which the semiconductor wafer 10 is mechanically scanned.

In FIG. 10, the productivity improvement virtual implantation and irradiation region 22 is set with vertical bilateral symmetry. In other words, in 0, the thirteen scanning terminal end positions are set, but seven kinds of beam scanning lengths are set with vertical bilateral symmetry. Further, as conceptually described with reference to FIG. 7, a total of two wafer scanning terminal end positions in the wafer slow scanning direction for mechanically scanning the semiconductor wafer are regulated by the common tangent of the outer circumference of the elliptical beam and the outer circumference of the circular wafer on the upper and lower sides, respectively, and form a portion of the shape of the productivity improvement virtual implantation and irradiation region 22.

Here, one feature of the present invention is exemplified in FIG. 10 in relation to a wafer scanning position where a set value of the scanning terminal end position is changed. In certain embodiments of the present invention, at least one of wafer scanning positions where set values of a plurality of set scanning terminal end positions are changed in stages is set as a wafer scanning position where a beam centroid in the wafer slow scanning direction for mechanically scanning the wafer is present inside the semiconductor wafer, and, at least another wafer scanning position is set as a wafer scanning position where a beam centroid in the wafer slow scanning direction is present outside the semiconductor wafer. In FIG. 10, there are the thirteen scanning terminal end positions, and thus there are twelve wafer scanning positions where set values of the scanning terminal end positions are changed. Eight scanning terminal end positions of them are set such that beam centroids are present inside the semiconductor wafer, and four wafer scanning positions P1, P2, P13 and P14 are set such that beam centroids are present outside the semiconductor wafer.

As described above, in order to improve wafer productivity, it is important that a two-dimensional beam shape on the wafer plane be made to be similar to an elliptical shape, a boundary line of the virtual implantation and irradiation region 16 be defined by the common tangent of the outer circumference of the elliptical beam and the outer circumference of the circular wafer, and a scanned ion beam be controlled based thereon. If these circumstances are to be realized using set values of a plurality of set scanning terminal end positions and wafer scanning positions where the set values of the same plurality of set scanning terminal end positions are changed, it is appropriate that at least one of the wafer scanning positions where the set values of the scanning terminal end positions are changed is set such that a beam centroid is present inside the semiconductor wafer, and at least another wafer scanning position is set such that a beam centroid is present outside the semiconductor wafer. This setting technique takes into consideration a two-dimensional beam shape of a scanned ion beam, and is a technique which is made known for the first time by the setting method of a virtual implantation and irradiation region regulated by a common tangent of an outer circumference of an elliptical beam and an outer circumference of a circular wafer, described above. That is to say, in a case where the technique is not considered, a set value of a scanning terminal end position is not required to be changed at a position where a beam centroid is present outside the semiconductor wafer. Therefore, one of features of the present invention is to change a set value of a scanning terminal end position at the position where the beam centroid is present outside the semiconductor wafer.

Needless to say, the discussion on the setting of the productivity improvement virtual implantation and irradiation region 22 is also the same for an ion implantation method according to an embodiment of the present invention in a case where handling of wafer in-surface uniformity reduction is not required, described with reference to FIG. 6.

In addition, needless to say, the discussion on the setting of the productivity improvement virtual implantation and irradiation region 22 is also the same for a case where certain embodiments of the present invention are applied to the two-dimensional mechanical wafer scanning ion implantation apparatus.

Hereinafter, ion implantation control according to an embodiment of the present invention will be described further in detail based on a practical operation of the ion implantation apparatus. For convenience of description, the hybrid scanning ion implantation apparatus will be described as an example.

As described above, the ion implantation apparatus according to the embodiment of the present invention includes the CPU 14 which performs control and the RAM 15 which stores positions of the semiconductor wafer 10 in the vertical direction (the wafer slow scanning direction). In addition, the CPU 14 may read a position of the semiconductor wafer 10 in the wafer slow scanning direction, stored in the RAM 15, as necessary. In certain embodiments of the present invention, the CPU 14 reads a position of the semiconductor wafer 10 in the wafer slow scanning direction stored in the RAM 15 at all times, and changes a set value of a scanning terminal end position when the semiconductor wafer 10 arrives at a wafer scanning position where the set value of the scanning terminal end position is to be changed. That is to say, set values of a plurality of set scanning terminal end positions are changed in stages according to positions of the semiconductor wafer 10 in the wafer slow scanning direction under the control of the CPU 14 by using position information of the semiconductor wafer 10 in the wafer slow scanning direction stored in the RAM 15.

At this time, ion implantation into the semiconductor wafer 10 is not stopped, and set values of a plurality of set scanning terminal end positions are only changed according to wafer scanning positions of the semiconductor wafer 10 in the wafer slow scanning direction. Ions are implanted into the entire surface of the wafer while changing a plurality of set values of scanning terminal end positions, and thereby wafer in-surface uniformity of an ion implantation amount is secured, and wafer productivity is improved.

As described above, needless to say, at least one of the wafer scanning positions where the set values of a plurality of set scanning terminal end positions are changed is a wafer scanning position where a beam centroid of a scanned ion beam is present inside the semiconductor wafer in the wafer slow scanning direction, and at least another wafer scanning position is a wafer scanning position where the beam centroid of the scanned ion beam is present outside the semiconductor wafer in the wafer slow scanning direction.

At this time, ion implantation into the semiconductor wafer 10 is not stopped, and set values of a plurality of set scanning terminal end positions are only changed according to wafer scanning positions of the semiconductor wafer 10 in the wafer slow scanning direction. Ions are implanted into the entire surface of the wafer while changing a plurality of set values of scanning terminal end positions, and thereby wafer in-surface uniformity of an ion implantation amount is secured, and wafer productivity is improved.

Here, although set values of a plurality of set scanning terminal end positions are changed according to wafer scanning positions, as described above, in relation to an ion beam forming a practical scanned ion beam, a beam centroid position thereof in the wafer slow scanning direction may vary. In this case, a shape of the boundary line of the virtual implantation and irradiation region 16 and a shape of the boundary line of the productivity improvement virtual implantation and irradiation region 22 are regulated only by a two-dimensional beam shape and thus do not vary, but a wafer scanning position where a set value of a scanning terminal end position is changed necessarily varies. However, in this case as well, a scanned ion beam is measured in advance before ion implantation into the semiconductor wafer 10 so as to obtain a two-dimensional beam shape and measure variations in a beam centroid position, and thereby handling can be also performed by appropriately changing a wafer scanning position where a set value of a scanning terminal end position is changed.

As thus far been described above, according to the embodiments of the present invention, in the hybrid scanning ion implantation apparatus and the two-dimensional mechanical wafer scanning ion implantation apparatus, it is possible to handle a two-dimensional shape of an ion beam which is practically implanted, secure wafer in-surface uniformity of an ion implantation amount, and improve wafer productivity. In addition, when handling of wafer in-surface uniformity reduction is required, a scanning method in a beam scanning direction (fast scanning direction) is controlled so as to correspond thereto, thereby securing wafer in-surface uniformity of an ion implantation amount and improving wafer productivity even in a case where a slight beam variation occurs or a case where discharge occurs in beam transport equipment from the ion source to the semiconductor wafer and thereby ions do not arrive at the semiconductor wafer.

Although at least one exemplary embodiment has been described hitherto, the description is only an example, the present invention is not limited thereto.

It should be understood that the invention is not limited to the above-described embodiment, but may be modified into various forms on the basis of the spirit of the invention. Additionally, the modifications are included in the scope of the invention.

What is claimed is:

1. An ion implantation apparatus which transports ions generated by an ion source to a wafer as an ion beam, causes the wafer to undergo wafer mechanical slow scanning and also causes the ion beam to undergo beam fast scanning in a direction perpendicular to a wafer slow scanning direction or causing the wafer to undergo wafer mechanical fast scanning in a direction perpendicular to a wafer slow scanning direction, irradiates the wafer with the ion beam by using the wafer slow scanning in the wafer slow scanning direction and the beam fast scanning of the ion beam in the direction perpendicular to the wafer slow scanning direction or the wafer fast scanning of the wafer in the direction perpendicular to the wafer slow scanning direction, the apparatus comprising:
- a beam measurement unit that measures a two-dimensional cross-sectional beam shape of the ion beam before ion implantation into the wafer;
- a Random Access Memory (RAM) storing position information of the wafer in the wafer slow scanning direction; and
- a controller that defines an implantation and irradiation region of the ion beam by using the measured two-dimensional cross-sectional beam shape,
- wherein the controller makes the measured two-dimensional cross-sectional beam shape similar to an elliptical shape, sets a plurality of beam scanning lengths of the ion beam such that the entire elliptical beam travels off of the wafer on both ends of each beam scanning length and by using a common tangent of an outer circumference of the elliptical beam and an outer circumference of the wafer when the entire elliptical beam is off of the wafer, thereby regulates the implantation and irradiation region, each of the plurality of beam scanning lengths having a beam scanning terminal end position,
- wherein the controller changes the beam scanning terminal end position according to a position of the wafer in the wafer slow scanning direction using the position information stored in the RAM,
- wherein the implantation and irradiation region comprises a curve that varies in a stepwise shape, the stepwise shape comprising a plurality of steps wherein each step includes at least two successive beam scanning lengths that are the same, and
- wherein the beam scanning terminal end position of a minimum beam scanning length lies in the range of the wafer as compared with a wafer diameter of the central position in the wafer slow scanning direction of the wafer.

2. The ion implantation apparatus according to claim 1, wherein the controller regulates the implantation and irradiation region by using the common tangent of the outer circumference of the elliptical beam and the outer circumference of the wafer in an entire region of the outer circumference of the wafer.

3. The ion implantation apparatus according to claim 1, wherein the implantation and irradiation region is divided into two sides by a straight line including a wafer diameter in the wafer slow scanning direction, and
wherein, in order to secure wafer in-surface uniformity of an ion implantation amount and improve wafer productivity even in a case where a slight variation in an ion current amount occurs during ion implantation into the wafer, the controller regulates the implantation and irradiation region such that one side of the implantation and irradiation region has a rectangular shape, and the other side of the implantation and irradiation region has a shape regulated by the common tangent.

4. The ion implantation apparatus according to claim 2, further comprising:
- a measurement unit that measures wafer scanning positions in the wafer slow scanning direction,
- wherein the controller changes set values of the beam scanning terminal end positions according to wafer scanning positions in the wafer slow scanning direction measured by the measurement unit without stopping the ion implantation into the wafer, thereby implanting ions into the entire surface of the wafer.

5. The ion implantation apparatus according to claim 4, comprising set wafer scanning positions in the wafer slow scanning direction,
wherein at least one of the set wafer scanning positions in the wafer slow scanning direction is set such that the centroid position of the beam is present inside the wafer, and at least another one of the set wafer scanning positions in the wafer slow scanning direction is set such that the centroid position of the beam is present outside the wafer, the controller changing the set values of the beam scanning terminal end positions according to the set wafer scanning positions in the wafer slow scanning direction.

* * * * *